United States Patent
Hossain et al.

(10) Patent No.: US 11,641,200 B2
(45) Date of Patent: May 2, 2023

(54) CHARGE RECYCLING FROM IDLE CIRCUITS FOR IMPROVED ENERGY EFFICIENCY OF MULTI-VOLTAGE SYSTEMS

(71) Applicant: Drexel University, Philadelphia, PA (US)

(72) Inventors: Md Shazzad Hossain, Upper Darby, PA (US); Ioannis Savidis, Wallingford, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 17/307,118

(22) Filed: May 4, 2021

(65) Prior Publication Data
US 2021/0359675 A1    Nov. 18, 2021

Related U.S. Application Data

(60) Provisional application No. 63/019,559, filed on May 4, 2020.

(51) Int. Cl.
*H03K 17/16* (2006.01)
*G06F 1/3234* (2019.01)
(Continued)

(52) U.S. Cl.
CPC ......... *H03K 17/161* (2013.01); *G06F 1/3234* (2013.01); *G06F 1/3296* (2013.01); *H03K 19/0013* (2013.01)

(58) Field of Classification Search
CPC ............ H03K 17/161; H03K 19/0013; H03K 17/162; H03K 19/0019; H03K 19/0021;
(Continued)

(56) References Cited

U.S. PATENT DOCUMENTS 10,395,724 B1    8/2019  Myers
2008/0251852 A1*  10/2008  Arsovski .............. G11C 29/789
                                                        257/369

OTHER PUBLICATIONS

Zhang, et al. "A Cross-Layer Design Exploration of Charge-Recycled Power-Delivery in Many-Layer 3D-IC", Proceedings of the ACM/IEEE Design Automation Conference, pp. 1-6, Jun. 2015.
(Continued)

*Primary Examiner* — Jung Kim
(74) *Attorney, Agent, or Firm* — Schott, P.C.

(57) ABSTRACT

A method for the delivery of power to subthreshold (sub-Vt) circuits uses unused current during idle-mode operation of super-threshold (super-Vt) circuits is used to supply sub-Vt circuits. Algorithmic and circuit techniques use dynamic management of idle cores when reusing the leakage current of the idle cores. A scheduling algorithm, longest idle time-leakage reuse (LIT-LR) enables energy efficient reuse of leakage current, which generates a supply voltage of 340 mV with less than ±3% variation across the tt, ff, and ss process corners. The LIT-LR algorithm reduces the energy consumption of the switch and the peak power consumption by, respectively, 25% and 7.4% as compared to random assignment of idle cores for leakage reuse. Second, a usage ranking based algorithm, longest idle time-simultaneous leakage reuse and power gating (LIT-LRPG) enables simultaneous implementation of power gating (PG) and leakage reuse in a multiprocessor system-on-chip (MPSoC) platform.

5 Claims, 33 Drawing Sheets

(51) Int. Cl.
*H03K 19/00* (2006.01)
*G06F 1/3296* (2019.01)

(58) Field of Classification Search
CPC .. H03K 19/0027; G06F 1/3234; G06F 1/3296
See application file for complete search history.

(56) References Cited

OTHER PUBLICATIONS

S. Roy et al., "A Framework for power-gating functional units in embedded microprocessors", IEEE Transactions on Very Large Scale Integration Systems, vol. 17, No. 11, pp. 1640-1649, Mar. 2009.

T. Tong et al., "A Fully Integrated Reconfigurable switched-capacitor DC/DC converter with four stacked output channels, for voltage stacking applications", IEEE Journal of Solid State Circuits, vol. 51, No. 9, pp. 2142-2152, Jul. 2016.

E. Pakbaznia et al. "Charge Recycling in power-gated CMOS circuits," IEEE Transactions on Computer Aided Design of Integrated Circuits and Systems, vol. 27, No. 10, pp. 1798-1811, Oct. 2008.

K. Mazumdar et al. "Charge Recycling on-Chip DC-DC Conversion for Near-threshold operation," Preceedings of the IEEE Subthreshold Microelectronics Conference, pp. 1-3, Oct. 2012.

H. Cherupalli et al., "Enabling effective module-oblivious power fating for embedded processors", Proceedings of the IEEE International Symposium of High Performance Computer Architecture, pp. 157-168, Feb. 2017.

H. Singh et al., "Enhanced leakage reduction techniques using intermediate strength power gating", IEEE Transactions an Very Large Scale Integration Systems, vol. 15, No. 11, pp. 1215-1224, Nov. 2007.

R.T. Possignolo et al., "GPU NTC Process variation compensation with voltage stacking", IEEE Transactions on Very Large Scale Integration Systems, vol. 26, No. 9, pp. 1713-1726, Sep. 2018.

K. Roy et al., "Leakage current mechanisms and leakage reduction techniques in deep-submicrometer CMOS circuits", Proceedings of the IEEE, vol. 91, No. 2, pp. 305-327, Feb. 2003.

K. Blutman et al., "Lower power by voltage stacking: A fine-grained system design approach", Proceedings of the ACM/IEEE Design Automation Conference, pp. 78:1-78:5, Jun. 2016.

J. Leverich et al., "Power Management of datacenter workloads using per-core power gating", IEEE Computer Architecture Letters, vol. 8, No. 2, pp. 48-51, Aug. 2009.

R. Zhang et al., "Transient Voltage Noise in Charge-recycled power delivery networks for many-layer 3D-IC", Proceedings of the IEEE/ACM International Symposium on Low Power Electronics and Design, pp. 152-158, Sep. 2015.

M. Arora et al. "Understanding idle behavior and power gating mechanisms in the context of modem benchmarks on CPU-GPU integrated systems", Proceedings of the IEEE International Symposium on High Performance Computer Architecture, pp. 366-377, Mar. 2015.

A. Zou et al., "Voltage-stacked power delivery systems: reliability, efficiency, and power management, IEEE Transactions on Computer-Aided Design of Integrated Circuits and Systems", vol. 51, No. 9, pp. 2142-2152, Jul. 2016.

\* cited by examiner

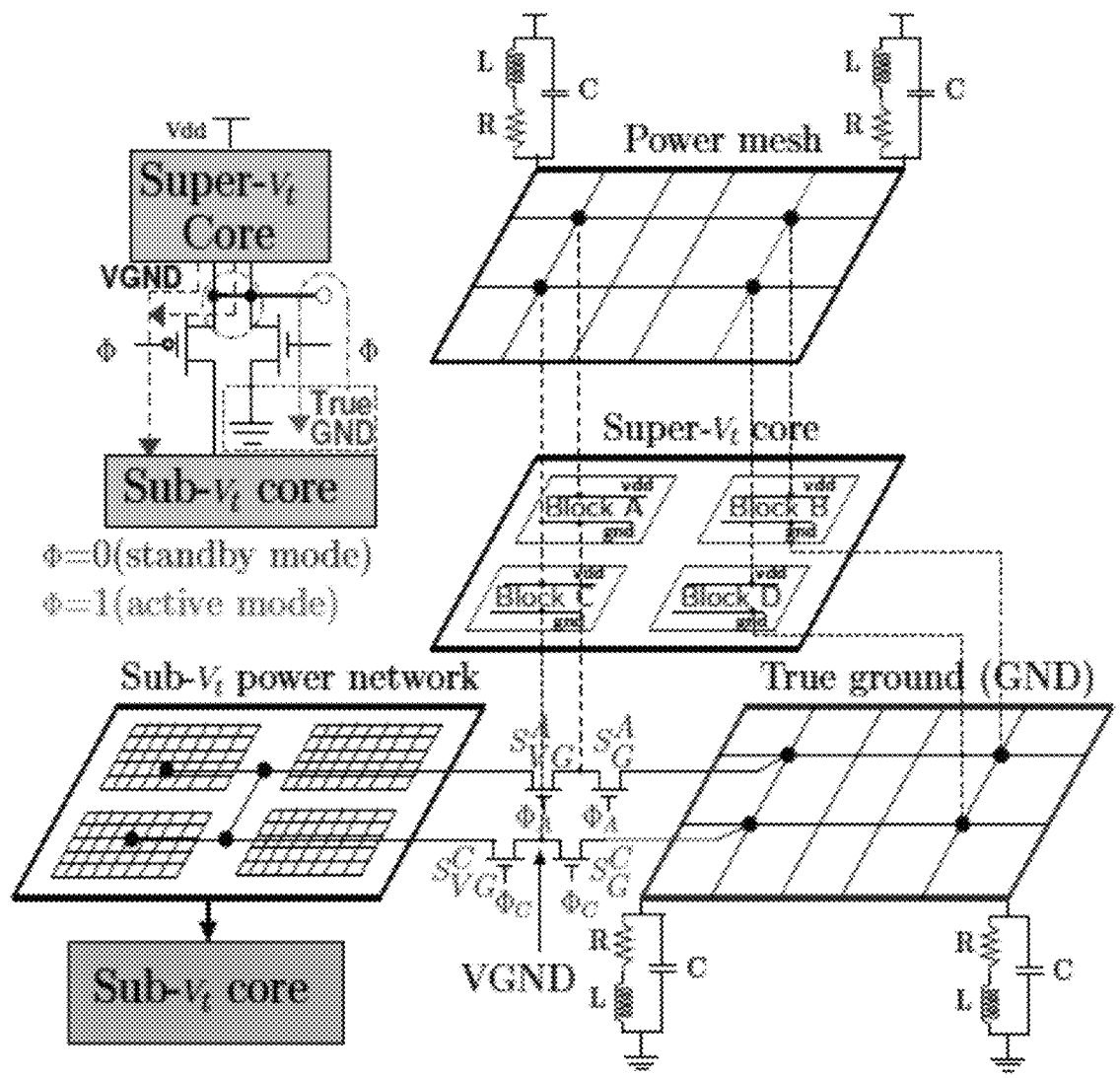
FIG. 1.1

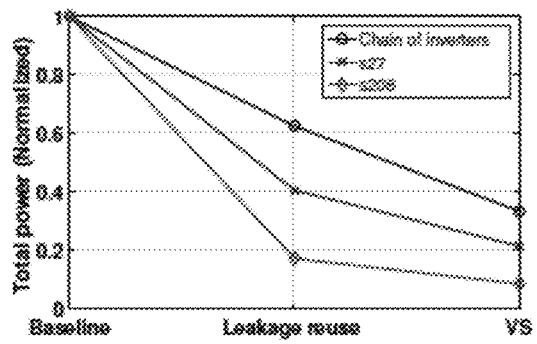
FIG. 1.2
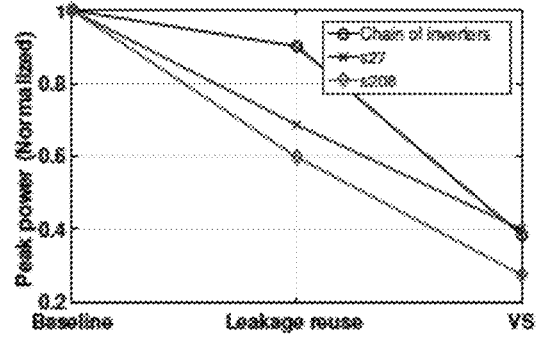
FIG. 1.3
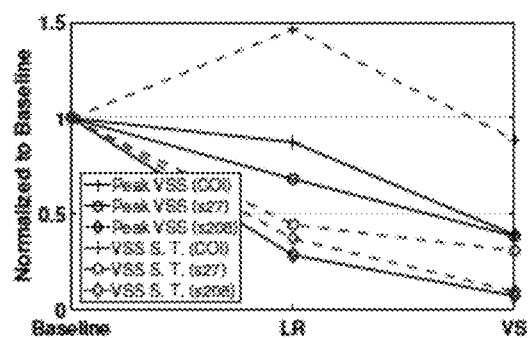
FIG. 1.4(a)
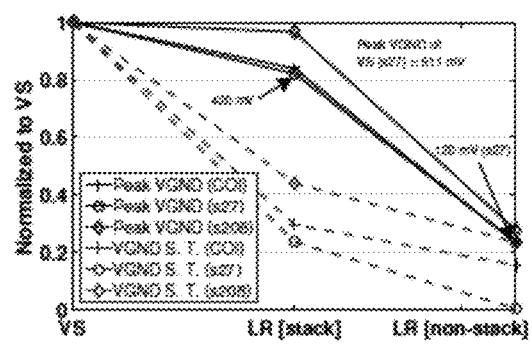
FIG. 1.4(b)

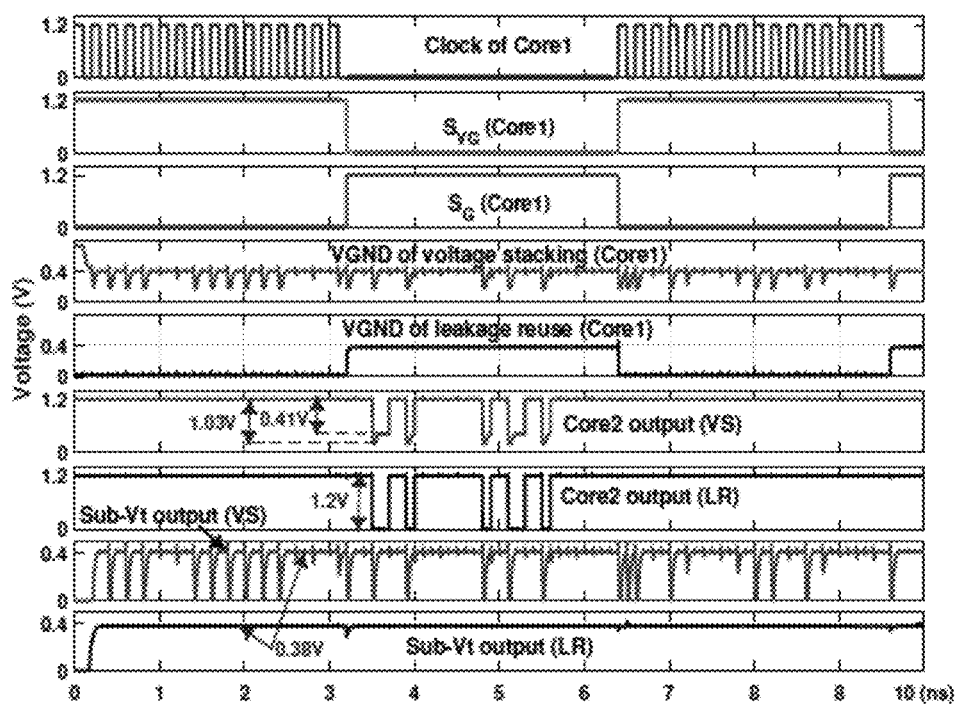
FIG. 1.5

|  |  | Area of super-$V_t$ circuit block ($\mu m^2$) | Switch area ($\mu m^2$) | Area of sub-$V_t$ circuit block ($\mu m^2$) |
|---|---|---|---|---|
| C01 | Baseline | 2.331 | N/A | 7.56 |
|  | Leakage reuse | 2.331 | 0.35 (15% of Super-$V_t$ C01) $S_{VG}$:$S_G$ of 1.5 $\mu m$: 2 $\mu m$ | 7.56 |
|  | Voltage stacking | 2.331 | N/A | 7.56 |
| s27 | Baseline | 6.73 | N/A | 21 |
|  | Leakage reuse | 6.73 | 0.31 (4.6% of Super-$V_t$ s27) $S_{VG}$:$S_G$ of 3 $\mu m$: 0.1 $\mu m$ | 21 |
|  | Voltage stacking | 6.73 | N/A | 21 |
| s208 | Baseline | 21.9 | N/A | 21 |
|  | Leakage reuse | 21.9 | 0.6 (2.7% of Super-$V_t$ s208) $S_{VG}$:$S_G$ of 5 $\mu m$: 1 $\mu m$ | 21 |
|  | Voltage stacking | 21.9 | N/A | 21 |

FIG. 1.A

| Total power normalized to baseline | Noise in $VGND$ [non-stack] as compared to ideal ground | | |
|---|---|---|---|
|  | 5% | 10% | 15% |
| C01 | 0.642 | 0.635 | 0.616 |
| s27 | 0.410 | 0.409 | 0.408 |
| s208 | 0.174 | 0.168 | 0.167 |

FIG. 1.B

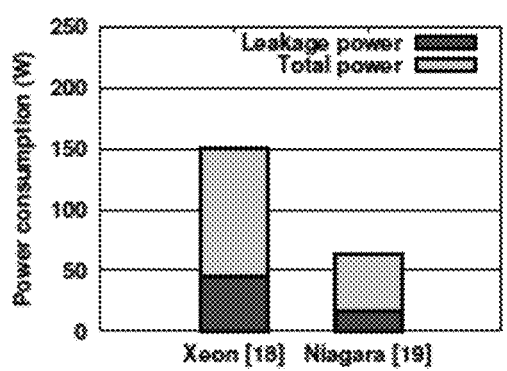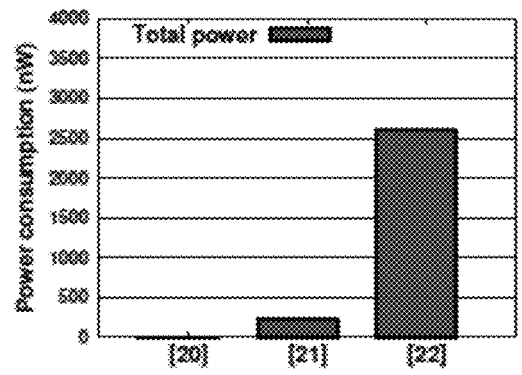
FIG. 2.1(a)　　　　　　　　FIG. 2.1(b)

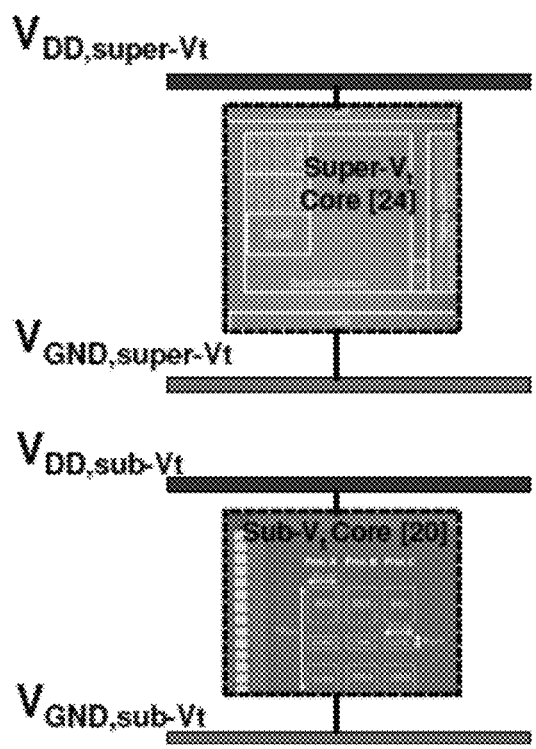 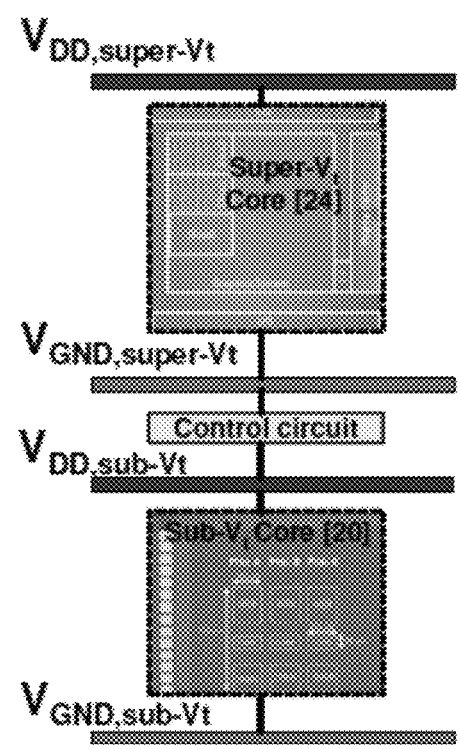
FIG. 2.2(a)  FIG. 2.2(b)

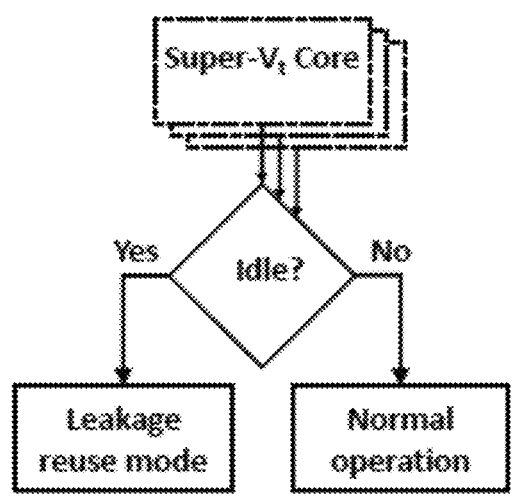
FIG. 2.3

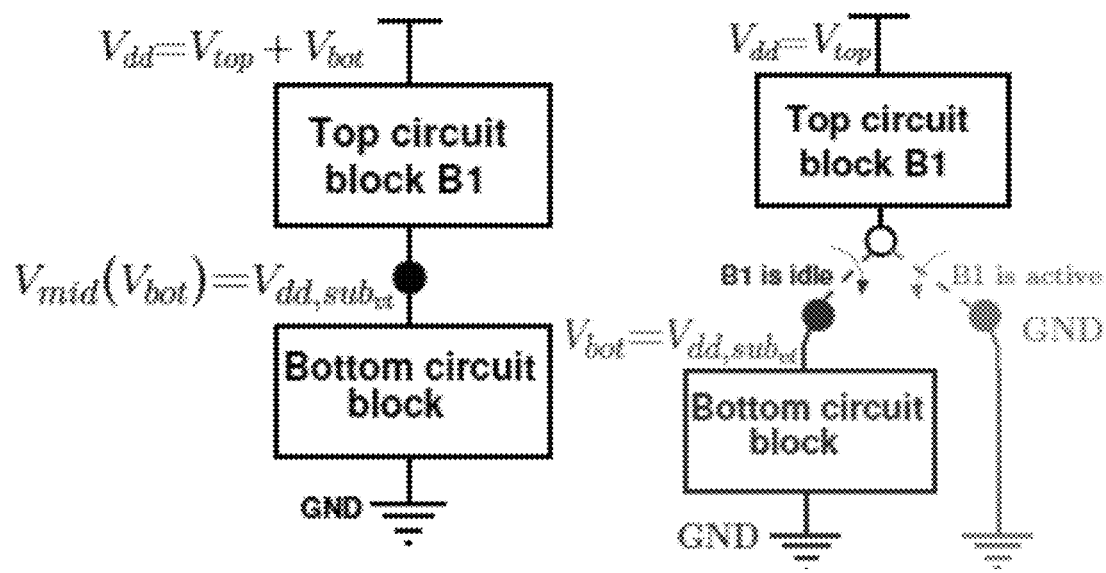
FIG. 2.4(a)  FIG. 2.4(b)

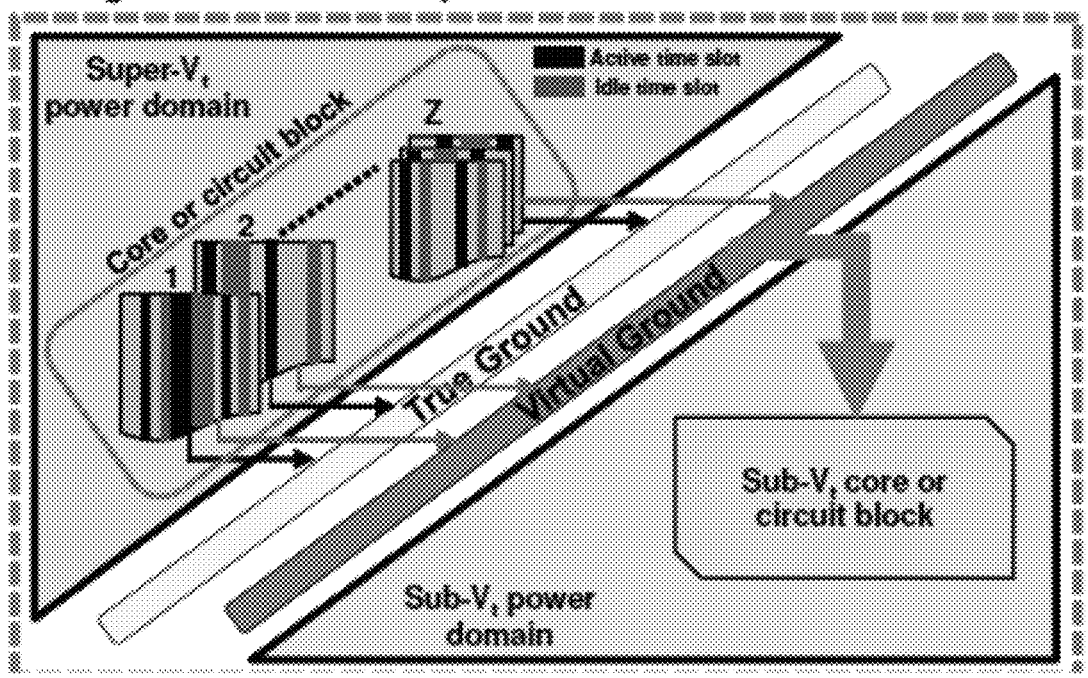
FIG. 2.5

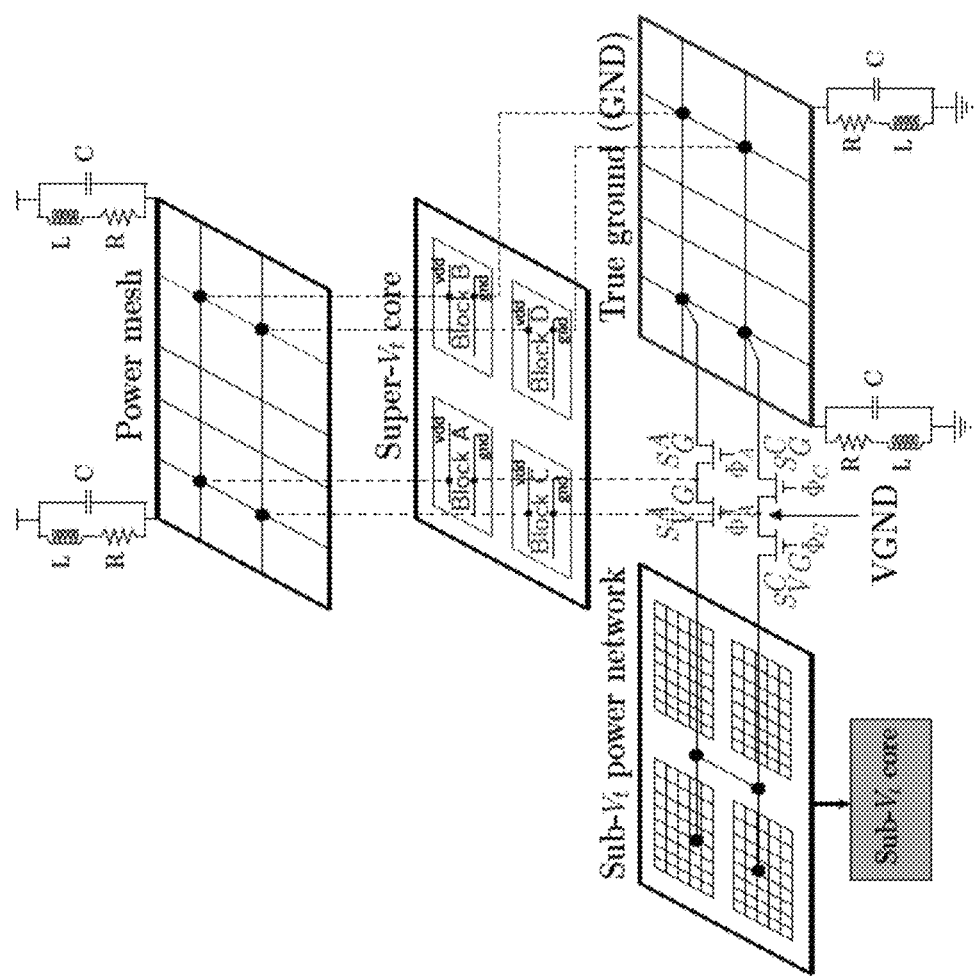
FIG. 2.6

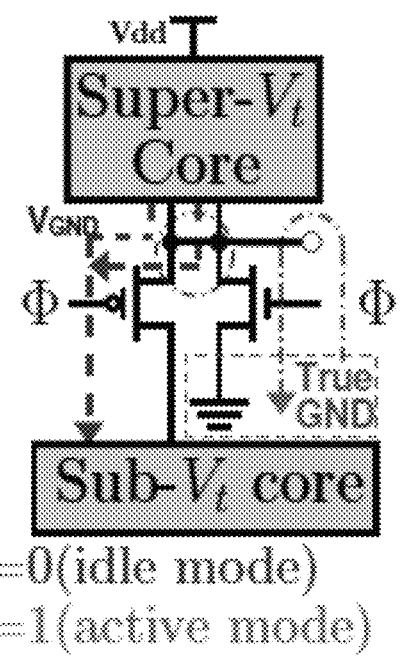
FIG. 2.7

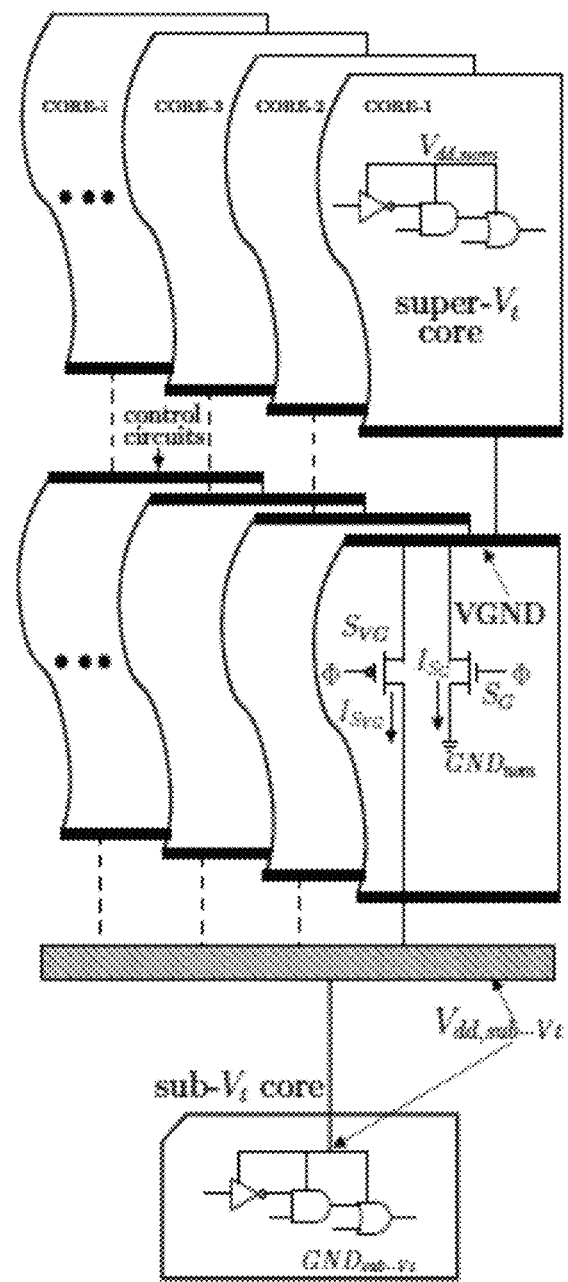
FIG. 2.8

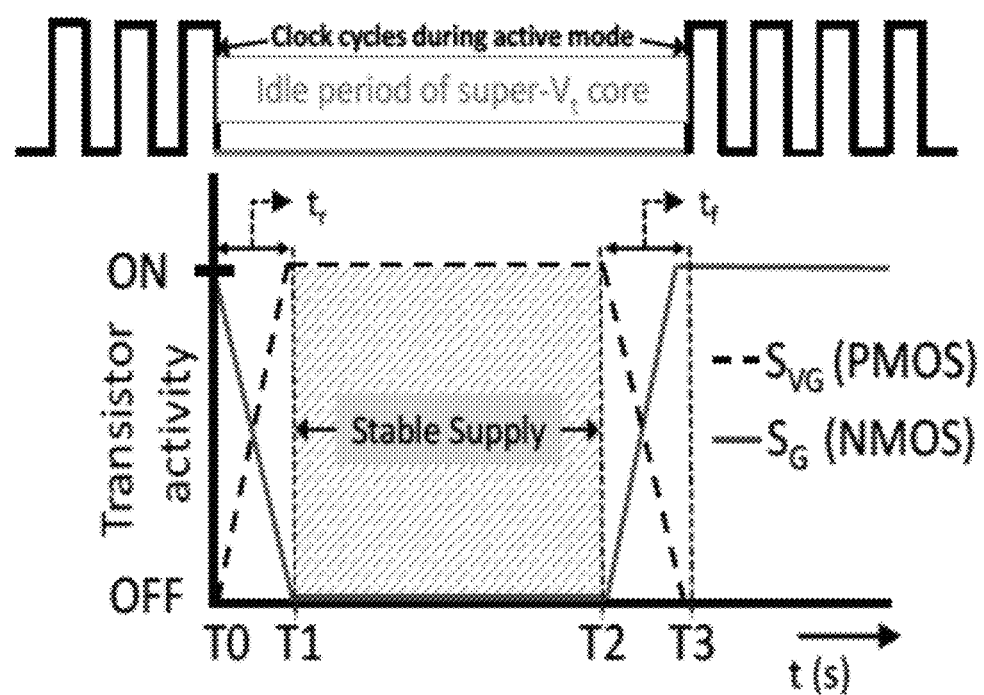
FIG. 2.9

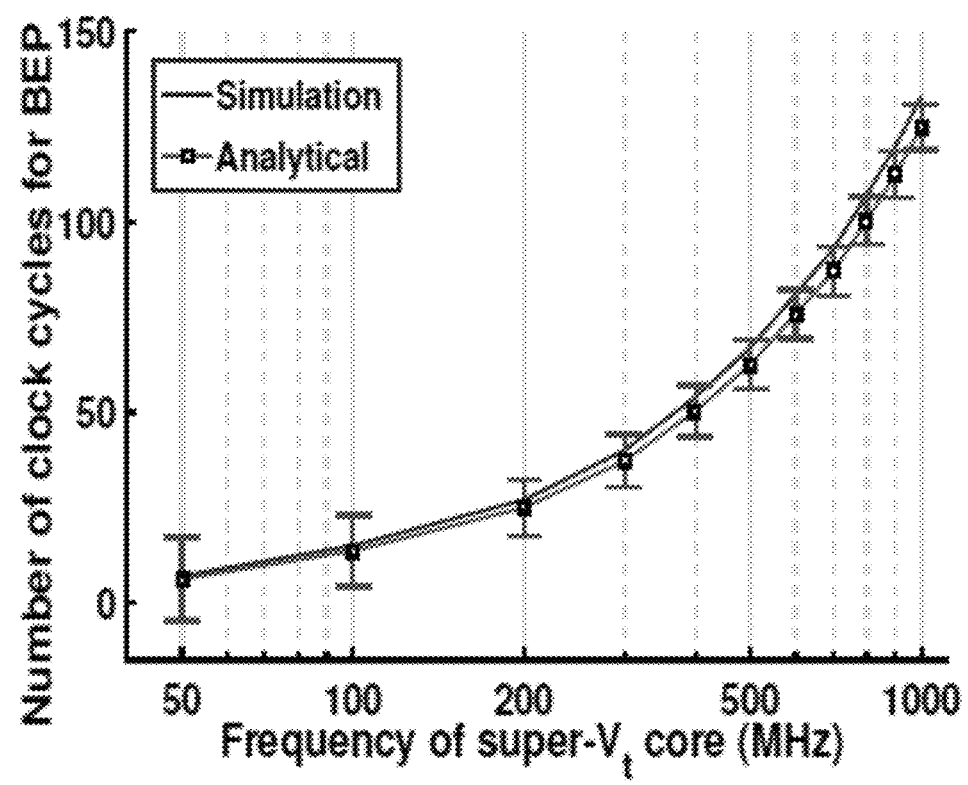
FIG. 2.10

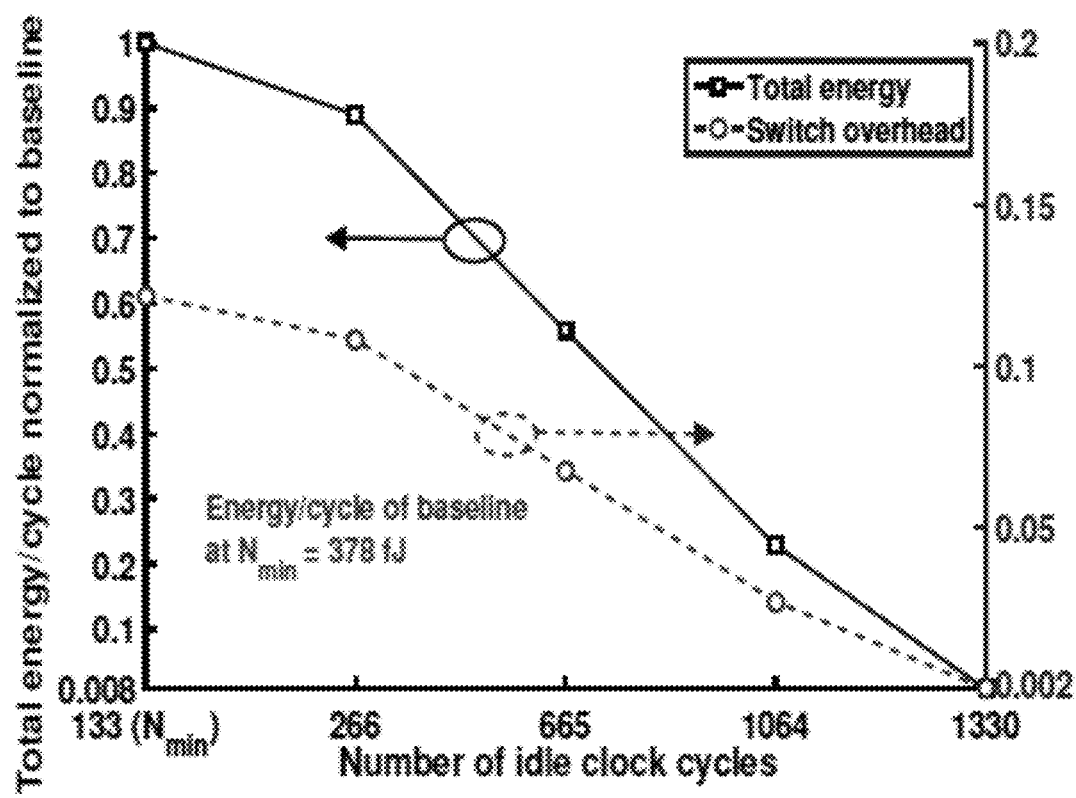
FIG. 2.11

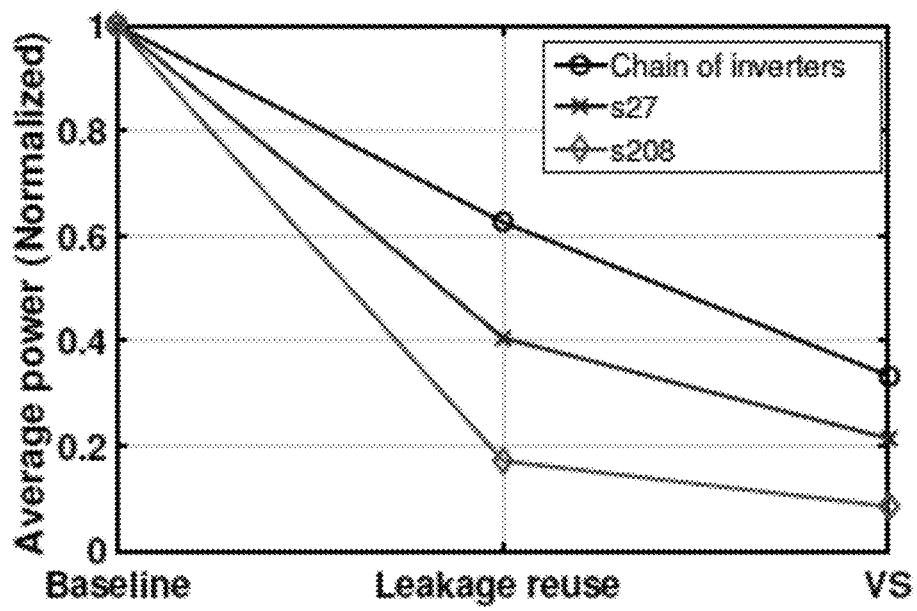
FIG. 2.12(a)
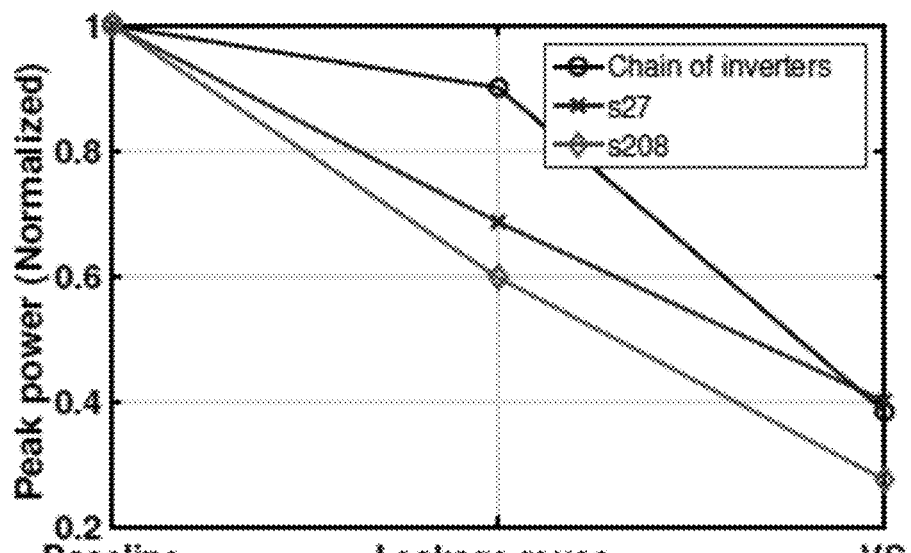
FIG. 2.12(b)

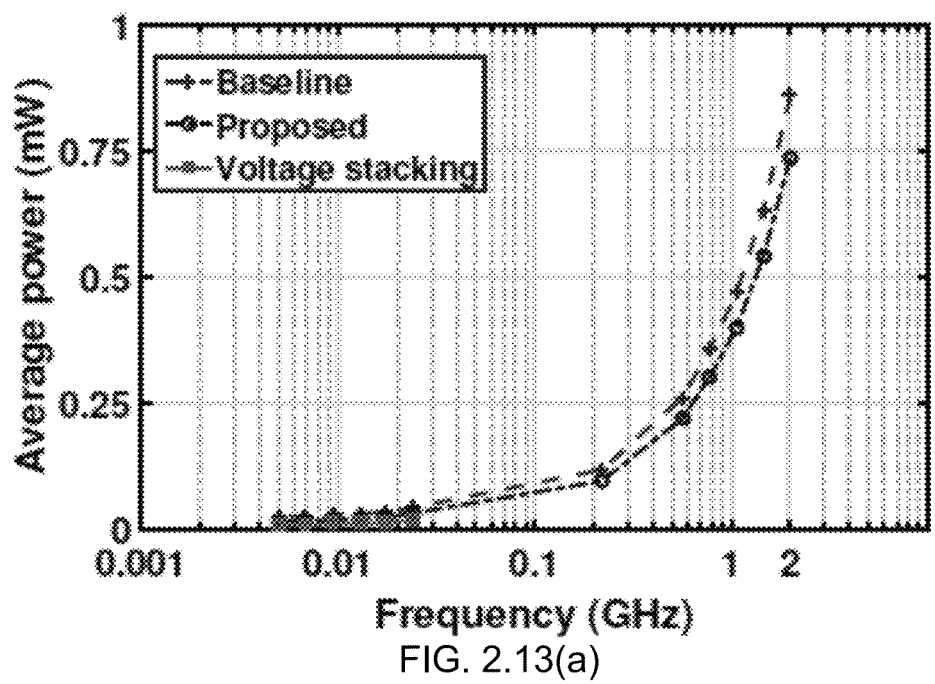
FIG. 2.13(a)
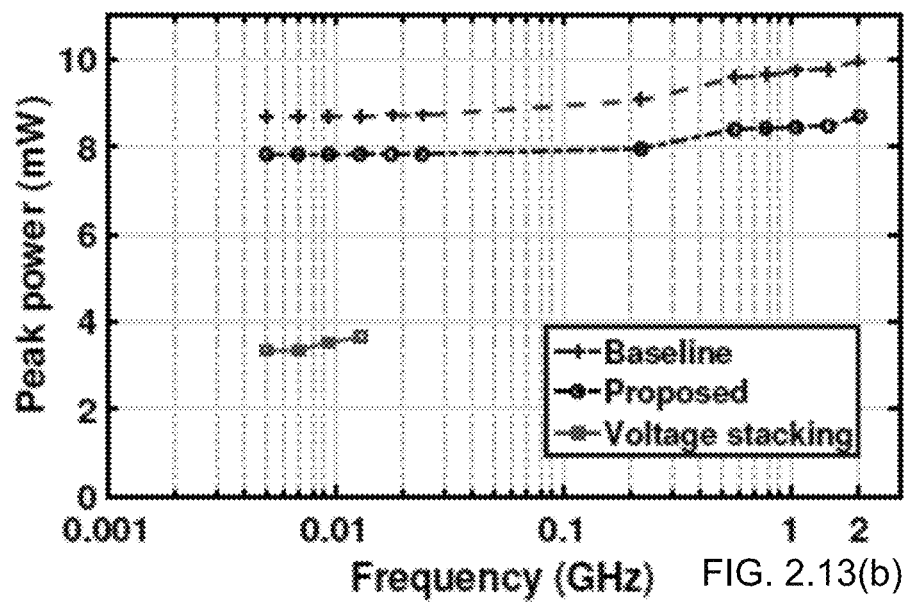
FIG. 2.13(b)

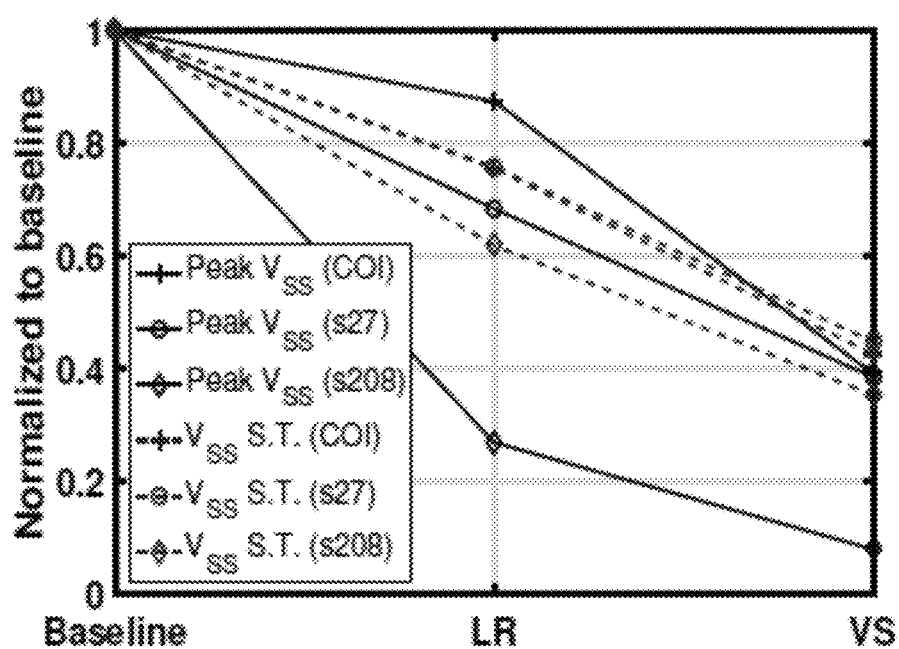
FIG. 2.14

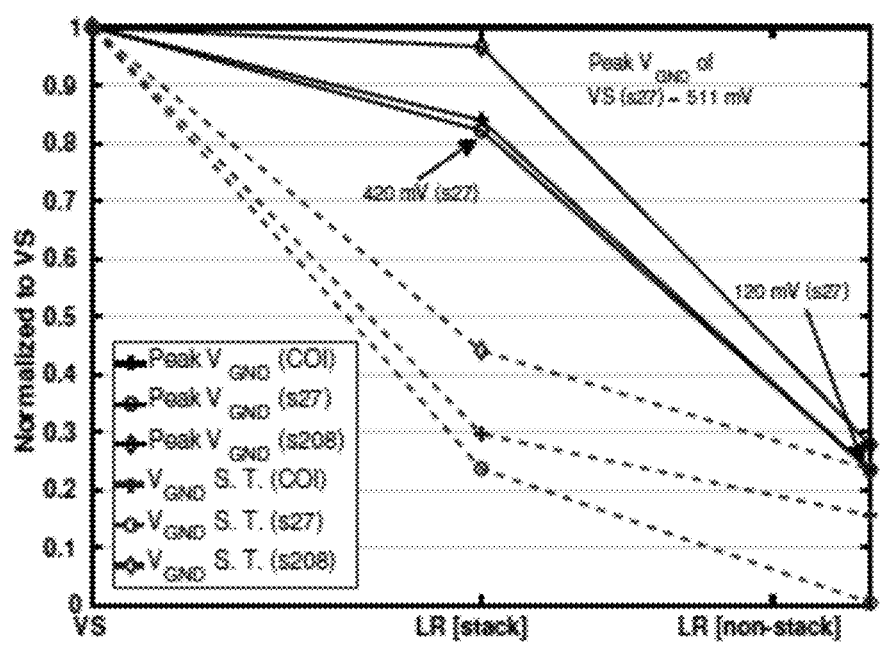
FIG. 2.15

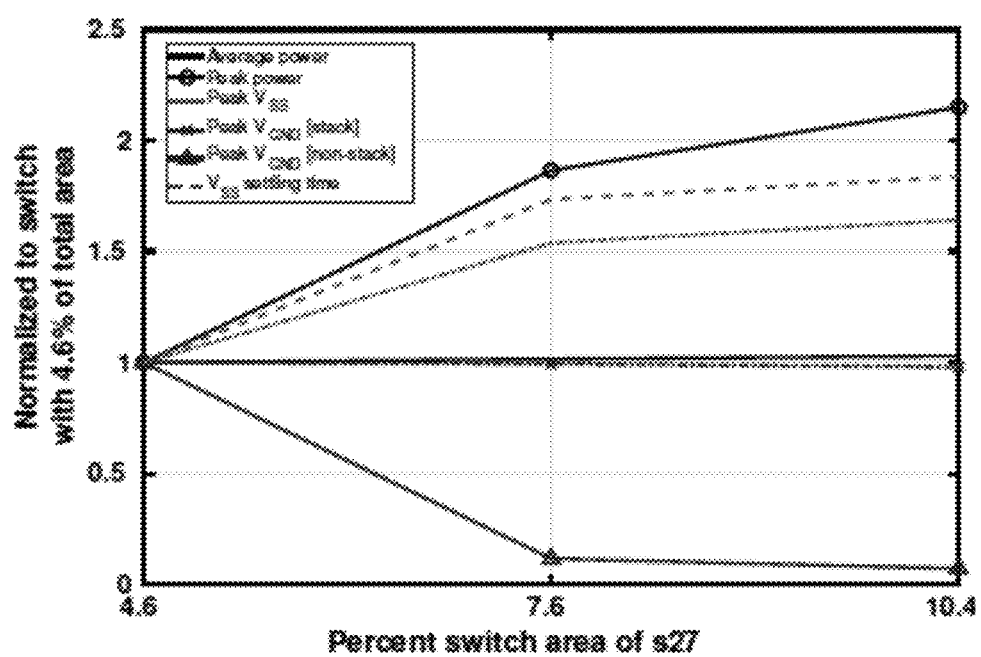
FIG. 2.16

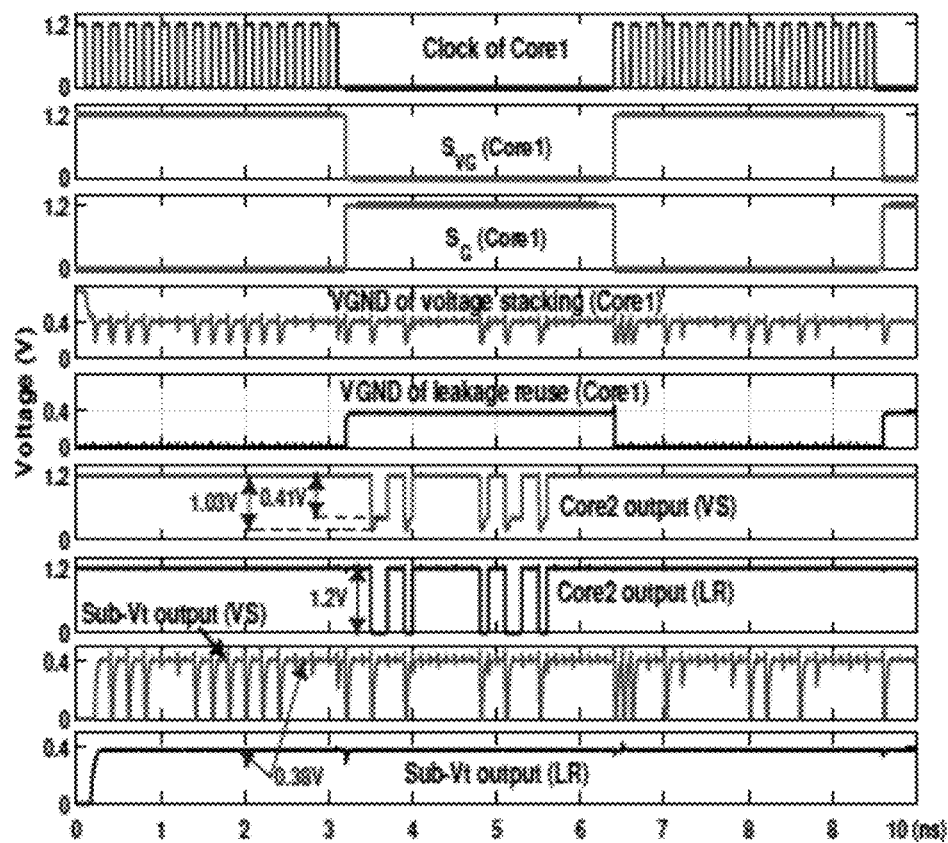
FIG. 2.17

| Parameter | Definition |
|---|---|
| $V_{dd,super-V_t}$ | Supply voltage of super-$V_t$ circuit |
| $V_{dd,sub-V_t}$ | Supply voltage of sub-$V_t$ circuit |
| $V_{GND}$ | Virtual ground voltage |
| $S_G$ | NMOS transistor connected to real ground |
| $S_{VG}$ | PMOS transistor connected to sub-$V_t$ core |
| $\alpha_{super-V_t}$ | Switching activity of super-$V_t$ core |
| $\alpha_{sub-V_t}$ | Switching activity of sub-$V_t$ core |
| $C_{S,super-V_t}$ | Total switching capacitance of super-$V_t$ core including drain, source, and gate capacitance as well as interconnects |
| $C_{int,super-V_t}$ | Total source capacitance of all transistors connected to virtual ground |
| $C_{S,sub-V_t}$ | Total switching capacitance of sub-$V_t$ core including drain, source, and gate capacitance of all transistors |
| $C_{VGND}$ | Total capacitance of virtual ground due to $S_G$ and $S_{VG}$ |
| $W_r$ | Ratio of switch size (sum of $S_G$ and $S_{VG}$) to the size of super-$V_t$ core |

FIG. 2.A

| | | Area of two super-$V_t$ circuit blocks ($\mu m^2$) | Switch area ($\mu m^2$) | Area of sub-$V_t$ circuit block ($\mu m^2$) | Peak noise on $V_{SS}$ as a percent of rail-to-rail voltage (1.2 V) |
|---|---|---|---|---|---|
| C01 | Baseline | 2.331 | N/A | 7.56 | < 5% |
| | Leakage reuse | 2.331 | 0.35 (15% of Super-$V_t$ C01) $S_{VG}$-$S_G$ of 1.5 $\mu m$: 2 $\mu m$ | 7.56 | < 5% |
| | Voltage stacking | 2.331 | N/A | 7.56 | < 5% |
| s27 | Baseline | 6.73 | N/A | 21 | < 5% |
| | Leakage reuse | 6.73 | 0.31 (4.6% of Super-$V_t$ s27) $S_{VG}$-$S_G$ of 3 $\mu m$: 0.1 $\mu m$ | 21 | < 5% |
| | Voltage stacking | 6.73 | N/A | 21 | < 5% |
| s208 | Baseline | 21.9 | N/A | 21 | < 5% |
| | Leakage reuse | 21.9 | 0.6 (2.7% of Super-$V_t$ s208) $S_{VG}$-$S_G$ of 5 $\mu m$: 1 $\mu m$ | 21 | < 5% |
| | Voltage stacking | 21.9 | N/A | 21 | < 5% |

FIG. 2.B

|  | | Noise on $VGND$ [non-stack] as compared to ideal ground | | |
|---|---|---|---|---|
|  | | 5% | 10% | 15% |
| Total power normalized to baseline | COI | 0.642 | 0.635 | 0.616 |
|  | s27 | 0.410 | 0.409 | 0.408 |
|  | s208 | 0.174 | 0.168 | 0.167 |
| Total area normalized to baseline | COI | 1.0480 | 1.0261 | 1.0182 |
|  | s27 | 1.0083 | 1.0079 | 1.0072 |
|  | s208 | 1.0096 | 1.0081 | 1.0075 |

FIG. 2.C

| | Total power ($\mu W$) | Peak power ($mW$) | Peak $V_{dd}$ ($V$) | Peak $V_c$ ($mV$) | Peak $V_{GND}$ (non-stack) ($mV$) | Peak $V_{GND,S}$ (stack) ($mV$) | Switching speed | Super-$V_t$ transistors | Switch transistors | Sub-$V_t$ transistors |
|---|---|---|---|---|---|---|---|---|---|---|
| Baseline | 13.47 | 4.154 | 1.210 | 17.66 | N/A | N/A | 4x clock speed | Low $V_t$ | N/A | Nominal $V_t$ |
| Leakage reuse | 6.446 | 3.023 | 1.211 | 13.41 | 120 | 420 | 4x clock speed | Low $V_t$ | NMOS: 0.9 µm (high-$V_t$), PMOS: 3 µm (low-$V_t$) | Nominal $V_t$ |
| Voltage stacking | 3.335 | 1.662 | 1.206 | 6.893 | N/A | 583 | 4x clock speed | Low $V_t$ | N/A | Nominal $V_t$ |

FIG. 2.D

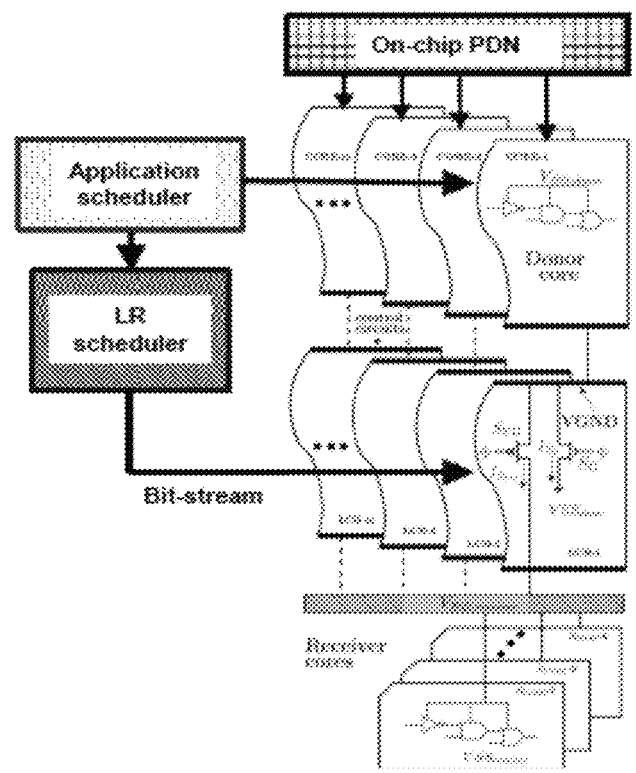
FIG. 3.1
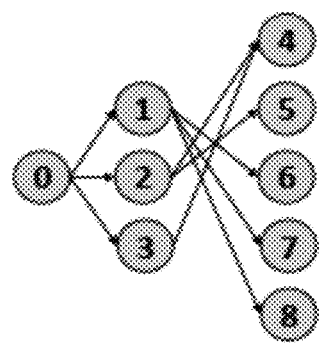
FIG. 3.2

FIG. 3.3

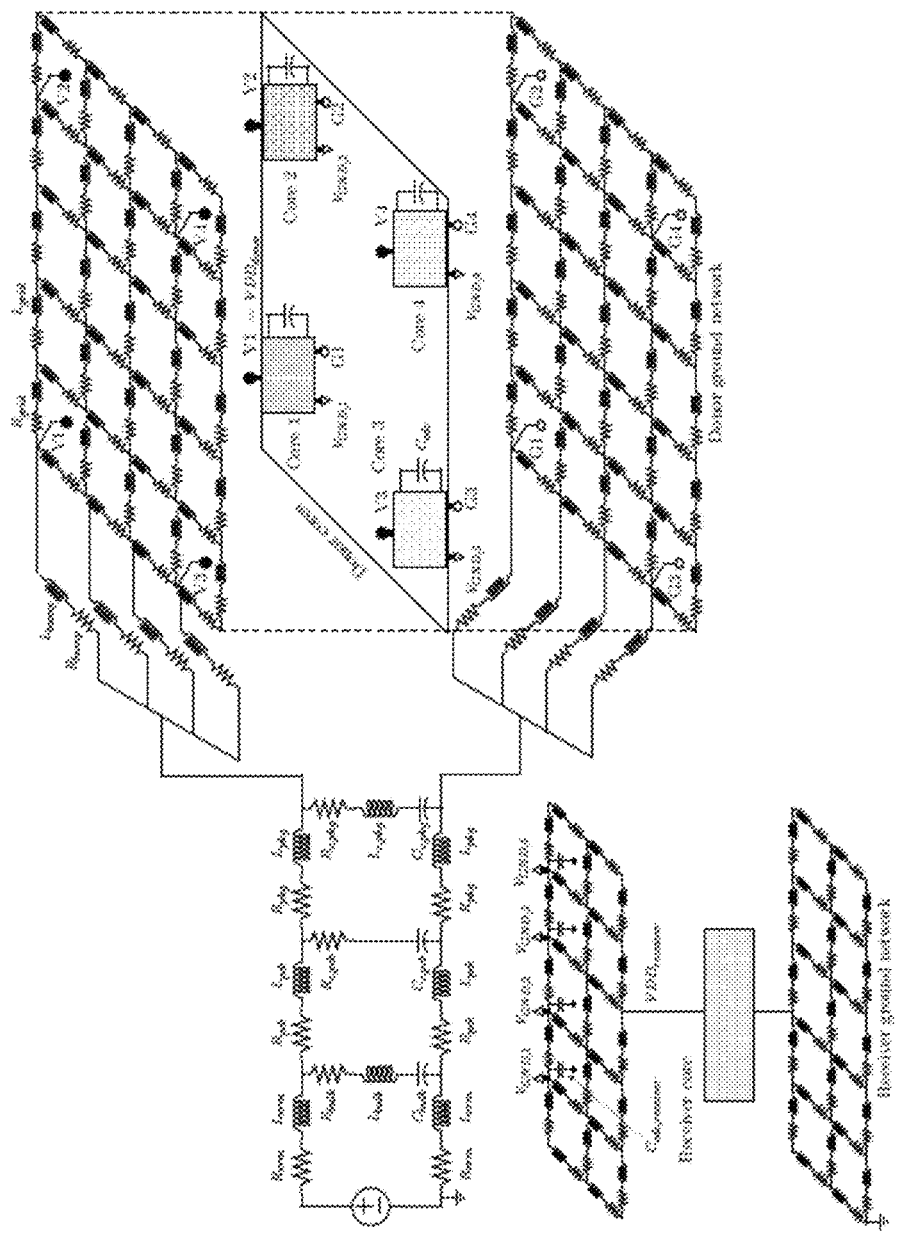
FIG. 3.4

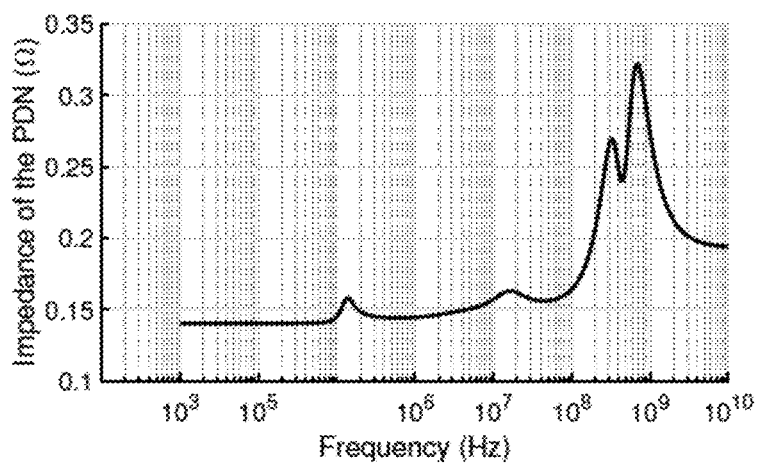
FIG. 3.5
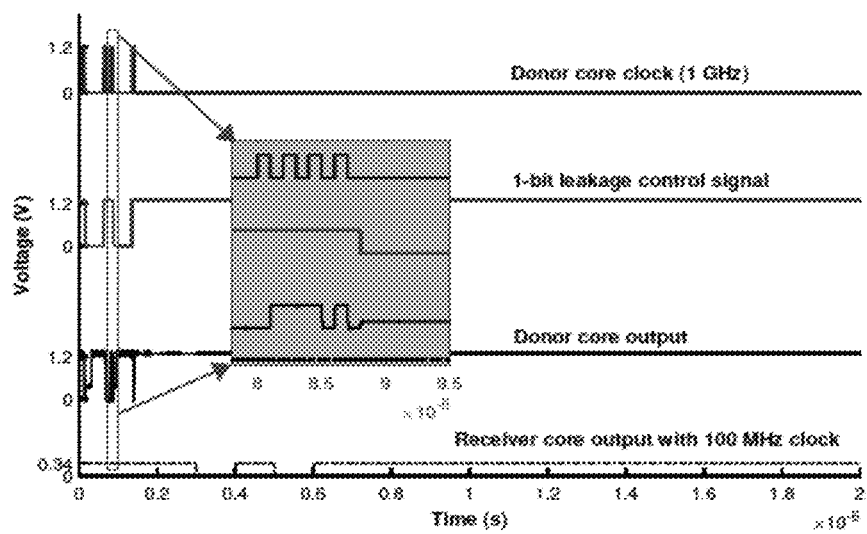
FIG. 3.6

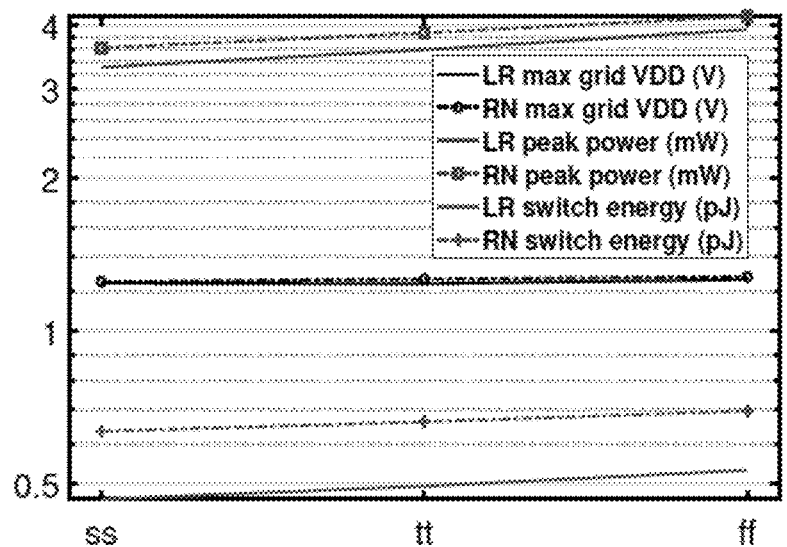
FIG. 3.7
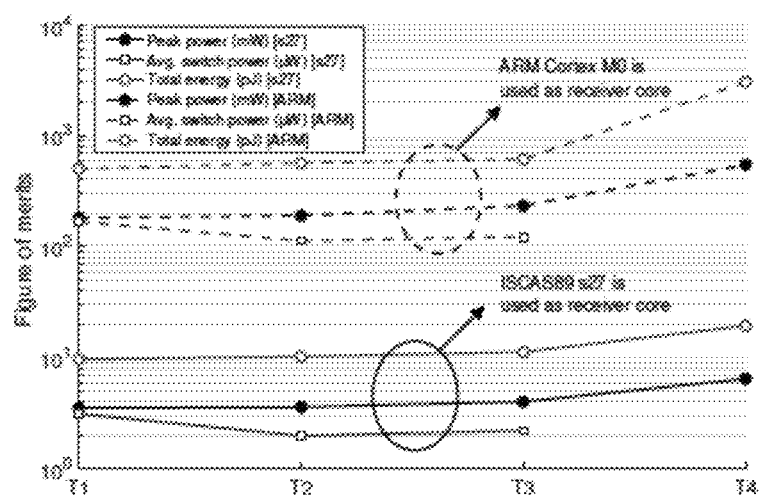
FIG. 3.8

Algorithm 1 Idle core assignment for leakage current recycling

Input: $m, Task_{num}, Order_{core}, Pcycles_{task\_i}, N_{BE\_LR}$.
Output: Available idle core assignment to be used for charge recycling with usage-based ordering $(LR_{cores})$ 1: while $i \leq Task_{num}$ do
2:     Calculate the time (number of cycles) to next processor assignment
3:     if $Pcycles_{task\_i} > N_{BE}$ then ▸ Break-even point for LR $N_{BE\_LR}$
4:         while $j \leq (Task_{num} - i)$ do
5:             Track the earliest execution start time of all of $Task_{num} - i$ tasks in $m$ number of cores.
6:             Store a ranking of each core in $Core_{m,ranking}$ based on the order in which each task is executed.
7:         end while
8:         if $i \neq (Task_{num} - 1)$ then
9:             $LR_{cores\_index}i \Leftarrow max(Core_{1,ranking}, Core_{2,ranking}, Core_{3,ranking}, \ldots Core_{m,ranking})$ ▸ Assigning the core with longest idle time for charge recycling
10:            $LR_{cores}i \Leftarrow Order_{core}LR_{cores\_index}i$
11:         else if $i == (Task_{num} - 1)$ then
12:             $LR_{cores}i \Leftarrow LR_{cores}0$ ▸ Tracking the core with longest idle time from the last application and assigning for current state
13:         end if
14:     else
15:         $LR_{cores}i \Leftarrow Order_{core}LR_{cores\_index}i - 1$ ▸ Keep the last core assignment for charge recycling
16:     end if
17: end while
18: return $LR_{cores}$

FIG. 3.I

Algorithm 2 Simultaneous implementation of leakage reuse and power gating

Input: $m, \delta_m, N_{BE,PG,m}, N_{BE,LR,m}$, task $Pcycles_{task,i}$, two-bit core tracker for $m$ cores $core_{i,m}$, which provides a ranking of each core based on the order in which each task is executed
Output: core assignment for leakage reuse $LR_{cores}$ and power gating $PG_{cores}$
Procedure: Assign idle cores to LR and PG 1: ▷ The following section replaces lines 8-15 in Algorithm 1
2: for $core$ 1, 2, ..., $m$ do
3: 
$$\max \quad X_m \cdot E_{saved,LR} m + Y_m \cdot E_{saved,PG} m$$
$$s.t. \quad LR_{wake-up} m \cdot X_m + PG_{wake-up} m \cdot Y_m \leq L_{max} m$$
$$E_{loss,LR} m \cdot X_m + E_{loss,PG} m \cdot Y_m \leq E_{loss,max} m$$
$$X_m, Y_m \geq 0$$

4:     if $X_m > Y_m$ then
5:         $\delta_m \Leftarrow 1$
6:     else
7:         $\delta_m \Leftarrow 0$
8:     end if
9:     if $core_i m$ 01 then ▷ Core $m$ is idle and not used for either LR or PG
10:         if $\delta_m$ 1 then ▷ LR is selected
11:             if $i \neq (Task_{num} - 1)$ then
12:                 $LR_{cores\_index} i \Leftarrow \max(Core_{1,ranking}, Core_{2,ranking}, Core_{3,ranking}, ... Core_{m,ranking})$ ▷ Assigning the core with longest idle time for charge recycling
13:                 $LR_{cores} i \Leftarrow Order_{core} LR_{cores\_index} i$
14:                 $PG_{second,max} \Leftarrow$ sort and assign core index with second longest idle time
15:                 $PG_{cores} i \Leftarrow Order_{core} PG_{second,max}$
16:                 $core_i m \Leftarrow 10$
17:                 $core_i PG_{second,max} \Leftarrow 11$
18:             else if $i == (Task_{num} - 1)$ then
19:                 $LR_{cores} i \Leftarrow LR_{cores} 0$ ▷ Tracking the core with longest idle time from the last application and assigning for current state
20:                 $PG_{cores} i \Leftarrow LR_{cores} 1$ ▷ Tracking the core with second longest idle time from the last application and assigning for current state
21:             end if
22:         else if $\delta_m$ 0 then ▷ LR is selected
23:             if $i \neq (Task_{num} - 1)$ then
24:                 $PG_{cores\_index} i \Leftarrow \max(Core_{1,ranking}, Core_{2,ranking}, Core_{3,ranking}, ... Core_{m,ranking})$ ▷ Assigning the core with longest idle time for power gating
25:                 $PG_{cores} i \Leftarrow Order_{core} PG_{cores\_index} i$
26:                 $LR_{second,max} \Leftarrow$ sort and assign core index with second longest idle time
27:                 $LR_{cores} i \Leftarrow Order_{core} LR_{second,max}$
28:                 $core_i m \Leftarrow 11$
29:                 $core_i PG_{second,max} \Leftarrow 10$
30:             else if $i == (Task_{num} - 1)$ then
31:                 $PG_{cores} i \Leftarrow PG_{cores} 0$ ▷ Tracking the core with longest idle time from the last application and assigning for current state
32:                 $LR_{cores} i \Leftarrow PG_{cores} 1$ ▷ Tracking the core with second longest idle time from the last application and assigning for current state
33:             end if
34:         end if
35:     end if
36: end for

FIG. 3.II

| Resistance | Value (Ω) | Inductance | Value (H) | Capacitance | Value (F) |
|---|---|---|---|---|---|
| $R_{vrm}$ | 100u | $L_{vrm}$ | 5n | $C_{bulk}$ | 132u |
| $R_{pcb}$ | 485u | $L_{bulk}$ | 510p | $C_{pcb}$ | 10u |
| $R_{bulk}$ | 4.365m | $L_{pcb}$ | 48p | $C_{pkg}$ | 440n |
| $R_{ppcb}$ | 10m | $L_{pkg}$ | 19p | $C_{odc}$ | 1n |
| $R_{pkg}$ | 123u | $L_{ppkg}$ | 104p | $C_{odc,receiver}$ | 50p |
| $R_{ppkg}$ | 15.72m | $L_{bump}$ | 38p | | |
| $R_{bump}$ | 400u | $L_{grid}$ | 5.6f | | |
| $R_{grid}$ | 50m | | | | |

FIG. 3.A

| | Execution order of donor cores | 1 | 2 | 3 | 1 | 1 | 4 | 3 | 4 | 2 |
|---|---|---|---|---|---|---|---|---|---|---|
| Idle core assignment | Leakage current recycling: LIT-LCR | 4 | 4 | 2 | 2 | 2 | 2 | 2 | 2 | 4 |
| | Leakage current recycling: Random | 2 | 1 | 4 | 2 | 3 | 1 | 2 | 3 | 1 |
| | Power gating (LIT-LCRPG) | 3,2 | 1,3 | 4,1 | 3,4 | 3,4 | 3,1 | 4,1 | 1,3 | 3,1 |

FIG. 3.B

| Switch size (%) | 7.5 | | | 15 | | | 30 | | |
|---|---|---|---|---|---|---|---|---|---|
| Corner | SS | TT | FF | SS | TT | FF | SS | TT | FF |
| Max. $Sub_{V_t}$ VDD (mV) | 336.5 | 340.6 | 345.4 | 337.2 | 341.2 | 345.9 | 338.6 | 342.4 | 346.9 |
| Min. $Sub_{V_t}$ VDD (mV) | 336.2 | 340.2 | 344.8 | 336.9 | 340.8 | 345.4 | 338.2 | 342 | 346.4 |

FIG. 3.C

CHARGE RECYCLING FROM IDLE CIRCUITS FOR IMPROVED ENERGY EFFICIENCY OF MULTI-VOLTAGE SYSTEMS

BACKGROUND

1. Background

1.1 Charge Recycling Background

The contribution of leakage current to the total on-chip power consumption of microprocessors and system on chips (SoCs) has been increasing due to a reduction in the gate length, the threshold voltage of the transistors, and the gate oxide thickness, as well as the increase in transistor density per unit area. In addition, the long idle periods of most battery-operated mobile devices makes leakage current a dominant component of the total power consumption. A technique to reuse leakage current, therefore, significantly reduces the total energy dissipation of an integrated circuit.

Current heterogeneous multi-core systems integrate high-performance super-Vt cores with energy-efficient cores operating at near- and sub-Vt voltages. State-of-the-art microprocessors operating at super-Vt supply voltages consume a significant portion of the total power as leakage, which provides no computational benefit. In contrast, the computation in sub-Vt circuits is performed by consuming only leakage current.

A technique to reuse (or recycle) leakage current of idle core(s) or circuit block(s), consequently, significantly reduces the total energy dissipation of an integrated circuit.

$$P_{total} = \alpha \cdot V^2 * C_L \cdot f + V \cdot I_{Leakage} \qquad \text{EQB1}$$

$$I_{Leakage} = I_{gate} + I_{sub-V_t} + I_{junction} \qquad \text{EQB2}$$

As the performance requirements of executing applications varies, the use of both low-performance energy-efficient cores and high-performance cores within a multi-core system may be needed to improve the overall energy-efficiency of the SoC. Current heterogeneous multi-core systems integrate high performance super-Vt cores and energy-efficient cores operating at near- and sub-Vt voltages. In addition, different voltage and frequency scaling techniques may be implemented to improve the energy efficiency of the circuit including adaptive voltage scaling (AVS), dynamic frequency scaling (DFS), dynamic voltage scaling (DVS), dynamic voltage and frequency scaling (DVFS), and dynamic voltage and threshold scaling (DVTS) to operate circuits from the super-Vt to sub-Vt region based on the performance requirements of the executing applications. State-of-the-art microprocessors operating at super-Vt supply voltages consume a significant portion of the total power as leakage, which provides no computational and storage benefit. In contrast, the computation and storage in sub-Vt circuits is performed by consuming only leakage current.

The total and leakage power consumption of cores and SoCs implemented for both super-Vt and sub-Vt operation are shown in FIGS. 2.1(a) and 2.1(b), respectively. The leakage power consumption of a Xeon Tulsa processor operating at 3.4 GHz and with a 1.25 V supply is 44.1 W, which is equivalent to 31% of the total power consumption of 150 W as shown in these figures. Similarly, the leakage power consumption of the UltraSPARC T1 Niagara processor is 16 W, 26% of the total power of 63 W when operating at 1.2 GHz and with a 1.2 V supply. Prior work implementing sub-Vt processors indicate ultra low power operation and very low energy dissipation per instruction. A sub-Vt processor implemented in a 130 nm technology for sensory network applications operates at 66 KHz and at a 160 mV supply voltage, resulting in a power consumption of 11 nW. A sub-Vt Phoenix processor implemented in a 180 nm technology for sensing applications operates at 106 KHz and at a 500 mV supply voltage, resulting in a power consumption of 35.4 pW and 226 nW in, respectively, idle and active mode. In addition, a sub-Vt SoC implemented in a 130 nm technology for wireless electrocardiogram (ECG) monitoring, operating at 475 KHz and at a 280 mV supply voltage, consumes 2.6 W of power. A tiny fraction of the total leakage power dissipation from the processors operating at a nominal supply voltage is, therefore, sufficient to drive an entire sub-Vt processor. Note that the terms nominal and super-Vt are used interchangeably.

Power and clock gating are the most common techniques implemented to reduce the power consumption during idle mode operation of the circuit. In certain prior art, a machine learning based prediction method in conjunction with an OS power management policy is implemented in state-of-the-art multi-core processors to assign cores to a C-state based on the idleness of a given core, where the C-4 state places the core in power gated mode. For the analysis of system idleness, a 3 GHz quad-core processor ran for 10K cycles. Within the 10K cycles, there was not a single instance when all cores were simultaneously active. In addition, the SPECWeb benchmark suite was executed on a dual-core processor, and similarly, there was no instance when both cores were concurrently active.

Per core power gating (PCPG) has been proposed as an additional power management option for multi-core processors along with dynamic voltage and frequency scaling. In some art, core utilization traces are simulated to analyze PCPG using a 2.5 GHz AMD Phenom X4 9850, which includes four cores implemented in a 65 nm technology. The utilization traces for a commercial application server (PHARMA04), two web servers (HCOM10, ECOM3), and a desktop computer (DESKTOP) are used to observe the activity of the four cores, and again, there is no instance when all four cores are simultaneously active. In addition, the idleness behavior of state-of-the-art processors is characterized using both consumer and CPU-GPU benchmarks including DirectX9, KMeans, and Gaussian. Although the traditionally applied architectural benchmarks SPEC and PARSEC provide highly active workloads, where unrealistically few idle periods exist, the simulation of these benchmark workloads indicates significant overhead in power consumption due to idle intervals. For example, an analysis of modern CPU and GPU benchmark workloads demonstrates that a minimum of 110 multi-cycle idle events per second occurred for a broad range of applications executing on a 16 nm FinFET technology.

1.2 Dynamic Core Management Background

Leakage current results in energy waste as no computation or data storage is performed with leakage. The state-of-the-art CPU, GPU, accelerators, SoCs, and any battery operated low-power devices consume a significant portion of the total energy of an integrated circuit (IC) as leakage due to increased idle times while executing a diverse set of applications.

Power gating (PG), a method to disconnect idle circuits from the power grid, is a widely used power management technique PG with single and multiple sleep modes raises the voltage at the virtual ground node by up to VDD when applying a power-down mode and, therefore, reduces the leakage current of the circuit. However, the reduction in leakage current is achieved at a cost of large current transients in the power distribution network (PDN) and a large power consumption by the footer transistor (MOS switch) due to the discharging of the large virtual ground voltage to GND during mode transitions.

Techniques developed through prior research apply cut-off and intermediate mode power gating at the core, block, memory, and network-on-chip (NoC) level in CPU, GPU, and SoC platforms. A block level PG technique has been proposed that analyzes the correlation between RTL modules and, therefore, power gates the module(s) in the case of inactivity. A technique based on probabilistic analysis of NoC routers has been proposed, where queuing theory is used to model the break-even point in consumed energy when applying PG to the buffers of the router. In addition, PG is used to gate caches and GPUs of a multi-core platform to reduce energy loss due to leakage current.

SUMMARY OF THE EMBODIMENTS

2. Summary

2.1 Charge Recycling Summary

The leakage current of the idle cores or circuit blocks operating at a nominal supply voltage may be used to drive the circuits of a sub-Vt core. A methodology to reuse the leakage current from the nominal CMOS cores has been developed. A simple representation of a conventional power distribution network (PDN) with two independent voltage domains and the proposed PDN implementing the leakage reuse technique is shown in FIGS. 2.2(a) and 2.2(b), where the current from the super-Vt core reused by the sub-Vt core is regulated by the Control circuit block. In addition, the operating flow diagram of the proposed leakage reuse technique is shown in FIG. 2.3, where the super-Vt cores are switched to either normal or leakage reuse mode depending on the workload activity of super-Vt cores. The developed technique assigns an active super-Vt core to normal operating mode. An idle super-Vt core is, however, switched to leakage reuse mode to supply current to a low performance sub-Vt core. Given the growing interest in efficient power management techniques for multi-core systems, the proposed leakage reuse technique provides improved overall energy efficiency of multi-voltage domain SoCs consisting both super-Vt (high performance) and sub-Vt (low performance) cores.

The system and method described herein in at least sections 3.1 and 3.2 below provide:

1) A method and system to deliver power to sub-Vt circuits using the leakage current of super-Vt circuits operating in idle mode. Separate voltage regulators and power delivery network (PDN) are, therefore, not required or the sub-Vt circuits, unlike conventional power delivery to sub-Vt circuits that require an independent and dedicated PDN and expensive voltage regulators.

2) A reduction in the total leakage current of the super-Vt circuits due to power network stacking during idle mode operation without significantly affecting the performance of the super-Vt core(s) operating in active mode.

3) A reduction of the total power consumption of the multivoltage system by using the leakage current of idle super-Vt cores for computation and storage in sub-Vt cores.

The system and method may be applicable to any heterogeneous multi-core system implementing dynamic voltage scaling as well as multi-voltage domains integrating disparate technologies including 3-D integrated systems, multi-core systems composed of hybrid technologies, and neuromorphic systems.

2.2 Dynamic Core Management Summary

An alternative approach to reduce the leakage current of a circuit may include controlled recycling (reuse) of the leakage current of an idle core generates a small virtual ground voltage VGND that is used as a supply voltage for an active core. In addition, the technique reduces the leakage current through the idle cores and the power consumed by the footer MOS switches. The proposed technique may provide multiple benefits including at least: 1) A reduction in leakage current without a large overhead in wake-up energy due to the inherent voltage-stacking effect, and 2) an improvement in the overall energy efficiency of the IC by operating active core(s) with recycled leakage charge.

As described below in at least Section 3.3, idle cores from which leakage current is recycled may be defined as donor cores and active cores to which recycled charge is delivered as receiver cores. Both circuit and algorithmic techniques are proposed for a controlled leakage current recycling that reduces the energy consumption and improves the overall energy efficiency of the system. The proposed power management techniques are evaluated at the circuit layer and are characterized through SPICE simulation to accurately characterize the improved energy efficiency while accounting for process variation and the dynamic transients on the power delivery network (PDN).

The system and method described herein in at least section 3.3 below provide:

1) a dynamic idle core management technique and scheduling algorithm, longest idle time-leakage current recycling (LIT-LR), to optimally assign the idle donor circuit block(s) or core(s) for leakage current recycling, and 2) a technique and algorithm, longest idle time-simultaneous leakage reuse and power gating (LIT-LRPG), to optimally assign idle cores for simultaneous execution of power gating and leakage reuse.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1.1 shows the circuit model developed to analyze the leakage reuse technique.

FIGS. 1.2 and 1.3 show the total and peak power consumption of all three circuit topologies.

FIGS. 1.4(a) and (b) show characterization of a) the peak VS S bounce and the settling time of the peak VS S, and b) the peak VGND bounce and the settling time of the VGND node, where switches for the LR technique are sized for 10% noise on the stacked and non-stacked VGND.

FIG. 1.5 shows transient simulation of leakage reuse and voltage stacking techniques comparing the noise on the VGND node and the voltage of the output signals of the super-Vt and sub-Vt circuits.

FIG. 1.A shows a table showing the total active area for the super-Vt circuit blocks, sub-Vt circuit blocks, and switches.

FIG. 1.B shows a table showing the trade-off between the noise on VGND and the total power consumption when in the non-stack mode. Power consumption is normalized to the baseline (independent voltage sources for super-Vt and sub-Vt cores) for each circuit type.

FIGS. 2.1(a) and 2.1(b) show the total and leakage power consumption of cores and SoCs implemented for both super-Vt and sub-Vt operation.

FIGS. 2.2(a) and 2.2(b) show a simple representation of a conventional power distribution network (PDN) with two independent voltage domains and the proposed PDN implementing the leakage reuse technique respectively.

FIG. 2.3 shows the operating flow diagram of the proposed leakage reuse technique.

FIGS. 2.4(a) and (b) show (a) conventional method of voltage stacking, where the bottom circuit block is vertically stacked with a top circuit block regardless of the executing workloads of the top circuit block, and (b) the proposed technique of delivering current to sub-threshold circuit blocks where only an idle top circuit block is stacked.

FIG. 2.5 shows a system level model of reusing the leakage current of super-threshold circuits to drive sub-threshold circuits.

FIG. 2.6 shows the circuit model used to analyze the leakage reuse technique.

FIG. 2.7 shows MOS switches to connect the super-Vt core to true ground when active or to the sub-Vt core when idle.

FIG. 2.8 shows a schematic representation of the proposed technique to reuse the leakage current from i number of nominal cores supplying current to one sub-Vt core.

FIG. 2.9 shows switching transitions of SV G and SG corresponding to the time intervals when leakage reuse is active.

FIG. 2.10 shows a comparison between analytical and simulation results when determining the number of idle clock cycles of the super-Vt core corresponding to the break-even point in energy consumption for frequencies of 50 MHz to 1 GHz.

FIG. 2.11 shows a characterization of the energy per cycle normalized to the baseline for a range of idle cycles (133 to 1330) when the super-Vt core is operating at 1 GHz and for 1.33 s. The left Y-axis represents the energy consumed by both the super-Vt and sub-Vt core per cycle, while the right Y-axis represents energy consumed by switches SG and SV G per cycle.

FIGS. 2.12(a) and (b) show a characterization of a) average power consumption per cycle, and b) peak power consumption of the COI, s27, and s208 benchmark circuits at 5 MHz.

FIGS. 2.13(a) and (b) show a characterization of a) average power consumption per cycle and b) peak power consumption for 5 MHz to 2 GHz operation of the super-Vt circuit blocks.

FIG. 2.14 shows a characterization of the peak Vss bounce and the settling time (S.T.) of the peak Vss.

FIG. 2.15 shows a characterization of the peak VGND bounce and settling time of the VGND, where switches for LR are sized for 10% noise on the stacked and non-stacked VGND.

FIG. 2.16 shows variation in peak power, average power, and settling time for s27 as a function of switch size.

FIG. 2.17 shows transient simulation of the leakage reuse and voltage stacking techniques comparing the noise on the virtual ground node and the voltage of the output signals of the super-Vt and sub-Vt circuits.

FIG. 2.A shows a table showing circuit parameters used in the analysis of the energy break-even point of the leakage reuse technique.

FIG. 2.B shows a table showing active area of the chain of inverters (COI), s27, and s208 circuits for the three analyzed topologies.

FIG. 2.C shows a table showing trade-off between the noise on the V GND node, the total power consumption, and the area in the non-stacked mode. Power consumption and area are normalized to the baseline topology (independent power delivery networks for the super and sub-Vt cores) for the COI, s27, s208 circuits.

FIG. 2.D shows a table showing characterization through SPICE simulation of s27 implemented with the baseline, leakage reuse, and voltage stacking techniques.

FIG. 3.1 shows a system level model of the leakage reuse technique with dynamic idle core assignment.

FIG. 3.2 shows DAG with nine tasks representing the executing application for LIT-LR and LIT-LRPG algorithms.

FIG. 3.3 shows assignment of idle donor cores for leakage current recycling using LIT-LR algorithm.

FIG. 3.4 shows optimized PDN with off-chip and on-chip components designed to evaluate the LIT-LR and LIT-LRPG algorithms.

FIG. 3.5 shows impedance of the PDN with off-chip and on-chip components.

FIG. 3.6 shows a SPICE simulation results showing the activity of both donor and receiver cores when executing leakage current recycling using LITLR algorithm.

FIG. 3.7 shows a simulated figure of merits obtained using LIT-LR algorithm (solid lines) and random assignment (dotted lines).

FIG. 3.8 shows a simulated figure of merits using proposed Algorithm 2, where T1, T2, T3, T4 represents, respectively, simultaneous implementation of LR and PG, only LR, only PG, and baseline without LR and PG.

FIG. 3.I shows Algorithm 1.

FIG. 3.II shows Algorithm 2.

FIG. 3.A shows a table showing off-chip and on-chip parameters of simulated power delivery network.

FIG. 3.B shows a table showing an execution order of four donor cores and corresponding assignments by LIT-LCR and LIT-LCRPG algorithms for leakage current recycling and power gating.

FIG. 3.C shows a table showing supply voltage of the receiver core generated from recycled charge from idle donor cores.

DETAILED DESCRIPTION OF THE EMBODIMENTS

3. Description 3.1 Reusing Leakage Current for Improved Energy Efficiency of Multi-Voltage Systems 3.1.1 Circuit Model of the Leakage Reuse Technique The circuit model developed to analyze the leakage reuse technique is shown in FIG. 1.1. Four functional blocks within a core are implemented, which are supplied by a conventional hierarchical power delivery system. The ground network is, however, modified to leverage the leakage current from the super-Vt CMOS circuits. The functional blocks B and D are assumed to be performing a high activity workload and are also highly sensitive to ground bounce. Blocks B and D are, therefore, directly connected to true ground. The functional blocks A and C are, however, assumed to be performing low activity tasks and are less sensitive to ground bounce noise. In this case, the leakage current from blocks A and C is used to power the sub-Vt core. The total width of all transistors within a functional block provides an estimate of the total leakage current contributed during standby mode. A continuous power supply to the sub-Vt core exists, since at any given time at least one of the functional blocks is operating in idle mode.

Both the A and C blocks are grounded through two switches: one PMOS and one NMOS transistor (A through $S^A_{VG}$ and $S^A_G$, and C through $S^C_{VG}$ and $S^C_G$). Transistor $S^A_{VG}$ ($S^C_{VG}$) sinks current from block A (C) to the sub-Vt power network through a virtual ground during idle mode operation, while transistor $S^A_G$ ($S^C_G$) sinks current from block A (C) to the true ground while in the active mode.

The circuit implementation of the switching mechanism is shown on the left side of FIG. 1.1. The NMOS transistor connects the virtual ground to the true ground when either circuit block A or C is in active mode. The PMOS transistor connects the virtual ground to the power network of the sub-Vt core when either A or C is idle. The gates of transistors $S^A_{VG}$, $S^A_G$, $S^C_{VG}$, and $S^C_G$ are connected to control signals ΦA and ΦC as shown in FIG. 1.1. The value of ΦA and ΦC during idle and active mode is, respectively, 0 and 1. The transistors $S^A_{VG}$ and $S^C_{VG}$ must be large enough to quickly drain the leakage current through the virtual ground without causing significant delay and resistive drop, while the threshold voltages of transistors $S^A_G$ and $S^C_G$ may be large enough to prevent leakage loss during the idle mode of operation of the super-Vt cores.

There are some advantages of the proposed circuit technique, a few noted here: 1) a reduction in the total leakage power of the super-Vt cores, 2) a reduction in the total power consumption of the system by leveraging the leakage power of the super-Vt cores to supply current to circuits in the sub-Vt cores, and 3) no separate voltage source is required for the sub-Vt cores.

3.1.2 Simulation and Analysis

The proposed technique to reuse leakage power may be evaluated through SPICE simulation in a 45 nm CMOS process under the circumstances described herein. The super-Vt supply voltage is set to 1.2 V, while the sub-Vt supply voltage is set to 380 mV. The 45 nm CMOS process may include multi-threshold transistors, where low-threshold (low-Vt), nominal threshold (nominal-Vt), and high-threshold (high-Vt) devices are provided. Low-Vt transistors are used for the circuit blocks operating with a super-Vt supply voltage to improve performance, while nominal-Vt transistors are used for the circuit blocks operating with a sub-Vt supply voltage to reduce power consumption. In addition, high-Vt NMOS transistors are used for the sleep transistors $S^A_G$ and $S^C_G$ to reduce the power consumption during standby mode, while low-Vt PMOS transistors are used for the switches connecting to the sub-Vt core. Note that the threshold voltage for a nominal-Vt, low-Vt, and high-Vt NMOS transistor is, respectively, 410 mV, 322 mV, and 608 mV.

3.1.2.1 Modeling Methodology

The leakage reuse technique is evaluated using a chain of inverters (COI) and two ISCAS89 benchmarks circuit (s27 and s208). The ISCAS89 benchmark circuits are used to represent super-Vt cores, while the COI is used to represent both super-Vt and sub-Vt cores. The super-Vt chain comprises six equally-sized inverters, whereas the sub-Vt chain comprises six tapered inverters that are optimized for sub-Vt operation. The ground networks of both the COI and the ISCAS89 benchmark circuits are modified to enable a connection with either true ground or the sub-Vt power network through the virtual ground.

Three circuit topologies may be considered for this example simulation:

Topology 1 (Baseline): Two isolated super-Vt circuit blocks representing two individual super-Vt cores and one isolated sub-Vt circuit block (chain of tapered inverters) representing an individual sub-Vt core. Note that there is no connection between the super-Vt and sub-Vt circuit blocks, with each block supplied current independently, which is the conventional practice.

Topology 2—Proposed leakage reuse (L.R.): Two isolated super-Vt circuit blocks representing two individual super-Vt cores. The ground network of both super-Vt circuit blocks is connected to either true ground or the power network of a sub-Vt circuit block consisting of a chain of tapered inverters through the switching circuit shown in FIG. 1.1. The leakage current of the super-Vt circuit blocks supply the current required by the sub-Vt circuit block.

Topology 3—Voltage stacking (V.S.): Two isolated super-Vt circuit blocks representing two individual super-Vt cores, where the ground network of both super-Vt circuit blocks is directly connected with the power network of a sub-Vt circuit block including a chain of tapered inverters. Traditional voltage stacking techniques to generate near-Vt supply voltages may be modified herein to generate sub-Vt supply voltages.

Similar input signals and capacitive loads are used for all three topologies, which ensures that the active and idle mode transitions are equally applied to the three configurations. The power supply and ground networks of all three circuit topologies are represented with equivalent electrical parameters obtained from the Vcc and Vss pins of a DIP-40 package model to analyze the transient noise induced on the power and ground networks. The R, L, and C for the model are, respectively, 0.217, 8.18 nH, and 5.32 pF.

The three circuit topologies are implemented using a COI and the s27 and s208 ISCAS89 benchmark circuits, all operating at 5 MHz. The total active area for the super-Vt circuit blocks, sub-Vt circuit blocks, and switches is listed in the table in FIG. 1.A for a COI, s27, and s208. For each topology, a similar area is used, where the only exception is the additional area required for the switches when implementing the leakage reuse technique. Therefore, iso-frequency and iso-area analysis is performed on the three topologies.

The voltage on the virtual ground, which is the supply voltage of the sub-Vt block generated by the leakage current of the super-Vt cores, may be dependent upon several circuit parameters. The parameters include 1) the total leakage current of the super-Vt circuit blocks, 2) the contribution of leakage current from each super-Vt circuit block, 3) the on and off current through the switches, which are partly dictated by the threshold voltage, gate voltage, and the size of the switches, and 4) the total current required by the sub-Vt circuit block.

3.1.2.2 Characterization of Power Consumption

The total and peak power consumption of all three circuit topologies is shown in, respectively, FIGS. 1.2 and 1.3. The total power (and peak power) of the leakage reuse technique is reduced to 0.63× (0.9×), 0.41× (0.7×), and 0.17× (0.6×) that of the baseline for, respectively, a COI, s27, and s208. The results indicate an increasing benefit of implementing the leakage reuse technique as the size of a circuit increases. However, the leakage reuse technique consumes more power than the voltage stacking technique as the super-Vt and sub-Vt circuits are stacked for the entire duration of circuit operation when voltage stacking is implemented. The leakage reuse technique applied to s208 exhibits a total and peak power consumption of, respectively, 2.02× and 2.17× that of the voltage stacking technique.

3.1.2.3 Characterization of Noise on True and Virtual Ground

The voltage drop on the super-Vt power network is within +/−5% of the nominal voltage of 1.2 V for all circuit topologies. However, the voltage noise on the ground network exceeds +/−5% of the ideal ground voltage of 0 V. The characterization of the peak ground voltage bounce on ($V_{SS}$) and the settling time of the Vss node (the time required to settle within +/−5% of the ideal ground voltage) are shown in FIG. 1.4(*a*), where the results obtained for the leakage reuse and voltage stacking techniques are normalized to the results obtained for the baseline. The leakage reuse (LR) technique exhibits reduced peak noise on Vss and a shortened settling time of $V_{ss}$ as compared to the baseline for the chain of inverters (COI), s27, and s208 circuits. The implementation of the leakage reuse technique on s27 (s208) reduces the peak noise on Vss and the Vss settling time to, respectively, 0.68× (0.29×) and 0.44× (0.37×) that of the baseline.

Unlike the voltage stacking technique, the leakage reuse technique enables the stacking of idle super-Vt circuit blocks with the sub-Vt block, while the active super-Vt circuit blocks are connected to true ground. However, the noise transients propagate between the true ground of the active circuit blocks and the virtual ground of the idle circuit blocks. For the leakage reuse technique, the super-Vt active and idle circuit blocks are described as, respectively, non-stacked and stacked.

Similar to true ground, the VGND voltage bounce is analyzed by characterizing both the peak voltage noise at the VGND node and the settling time of the VGND node (the time required to settle within +/−5% of the steady state VGND) for all three circuit topologies. The results of the characterization of the voltage noise are shown in FIG. 1.4(*b*) for both the leakage reuse (stacked and non-stacked) and voltage stacking techniques. The voltage of the VGND node at steady state is the same as the supply voltage of the sub-Vt circuit, which is 380 mV. The peak VGND bounce and VGND settling time of the active circuit blocks when implementing the leakage reuse technique (non-stacked) are less than both the voltage stacking technique and the idle circuit blocks implemented with the leakage reuse technique (stacked), while ensuring that the voltage bounce on VGND for both the active and idle circuit block does not exceed 10% of the rail-to-rail voltage of, respectively, 1.2 V (super-Vt Vdd) and 380 mV (sub-Vt Vdd). The peak voltage noise on VGND (VGND settling time) for the leakage reuse technique implemented on the s208 circuit is reduced to 0.97× (0.4×) and 0.28× (0.23×) in, respectively, the stacked and non-stacked mode, as compared and normalized to the voltage stacking technique. The noise on the VGND node (non-stacked) is characterized for 15%, 10%, and 5% allowed voltage bounce, which results in an increase in the power consumption due to the larger switches necessary to reduce the noise on VGND, as shown from results listed in the table in FIG. 1.B. There is an average increase in the power consumption of 1.03× when the VGND bounce for the active circuit is constrained to 5% instead of 15% of the rail-to-rail voltage of Vdd.

3.1.2.4 Trade-off Between V. S. and Proposed L. R. Technique

The transient analysis of the leakage reuse and voltage stacking techniques is shown in FIG. 1.5, where the virtual ground bounce and the stability of the output voltages of the super-Vt and sub-Vt cores are compared. Similar clock and input switching patterns are applied to both implementations of the circuits.

The simulation is performed using two super-Vt cores each including an ISCAS s27 benchmark circuit and one sub-Vt core consisting of a chain of six inverters. The clock, S VG, S G, VGND, and output signals of one core are shown in FIG. 1.5, In addition, clock-gating is applied to core 1 when inactive. In the case of voltage stacking, although core 1 is idle, the switching transients (L•di=dt) of the super-Vt core 2 directly affects the VGND node, where charging and discharging of internal nodes causes significant voltage noise due to large internal capacitance. The noise induced on the VGND directly impacts the logical output of core 2, where the voltage for a logic 1 varies from 0.17 V to 0.41 V. The result is unwanted delay and logical failure for the circuits connected to the logical outputs of the voltage-stacked super-Vt cores. In addition, the noise induced on the VGND node of the voltage stacked super-Vt core generates a noisy VDD for the sub-Vt circuits. Therefore, additional voltage regulators are required to produce a steady supply voltage for the bottom core in the stack when voltage stacking is implemented, which results in a significant overhead in energy consumption.

In contrast, for the leakage reuse technique, the VGND node of core 1 is not affected by the switching of core 2. A stable voltage is, therefore, found at the VGND node that is used to supply current to the sub-Vt core. The logical outputs of core 2 are also full-swing voltage signals, even as core 1 is stacked with sub-Vt circuits. In addition, a stable virtual VGND voltage provides a stable sub-Vt Vdd and, therefore, a stable sub-Vt output signal as shown in FIG. 1.5.

The voltage stacking technique reduces the leakage current for the entire duration of operation through the stacking effect, which increases the effective resistance in a given charging or discharging path. Therefore, the total power, peak power, and peak Vss are reduced as compared to the baseline and leakage reuse technique at a cost of increased VGND bounce, as indicated by results shown in FIGS. 1.2, 1.3, 1.4(*a*), and 1.4(*b*). For s27 the peak VGND noise of the voltage stacking technique is 2.07× greater than the leakage reuse (non-stacked) technique, which imposes severe limitations for circuits operating in super-Vt as the drive strength of the NMOS transistors is significantly reduced. Therefore, the propagation delay of the circuits connected to the output of the super-Vt circuit block increases. The fanout-of-four (FO4) delay is characterized at 1.2 V in a 45 nm CMOS technology with ideal ground and for three peak VGND values of 120 mV, 420 mV, and 511 mV (see FIG. 1.4(*b*)).

The implementation of the voltage stacking and the leakage reuse techniques results in an increase of the FO4 delay by, respectively, 4.17× (VGND of 511 mV) and 1.24× (VGND of 120 mV) that of the baseline technique (ideal ground).

In addition, the noise margins of the circuits connected to the output of s27 are significantly degraded as VGND increases. The noise margins of a CMOS inverter (PMOS width of 3.6 μm and NMOS width of 1.2 μm) are characterized at a 5 MHz operating frequency and with 5 fF of capacitive load. The noise margin low of the inverter is 483 mV, which is less than the 511 mV VGND when implementing the voltage stacking technique. Therefore, a logic low is not discernible with the voltage stacking technique if an inverter is connected to the output of s27. In contrast, implementing the leakage reuse technique on s27 provides a discernible logic low as VGND is 120 mV, while also reducing the total and peak power to, respectively, 0.41× and 0.7× that of the baseline.

However, the delay increases by 1.24×. The peak voltage of 420 mV on VGND during the stacking mode of the leakage reuse technique does not effect the circuit delay and noise margin as the stacked super-Vt circuit blocks are in idle mode.

3.2 Recycling of Unused Leakage Current for Energy Efficient Multi-Voltage Systems This section in many ways repeats section 3.1 but supplement as it in more detail.

3.2.1 Availability of Idle Core(s) and Circuit Block(s)

Most modern low power circuit and power management techniques reduce the amount of energy consumed during idle mode operation of the circuit. Circuit blocks within a core or cores within a multi-core system are assigned to different operating modes (C-states) based on idle activity patterns to improve the performance per watt.

In this section, to characterize the CPU utilization of individual cores, simulation of a system running Red Hat Linux with 48 Intel Xeon CPU cores each operating at 3 GHz is used to execute different applications. At any given time, at least one core remains idle, while all 48 cores are idle for more than 90% of the runtime. Therefore, there are enough idle circuit blocks and cores within any system to allow for the reuse of unused leakage current.

3.2.2 Voltage Stacking During Idle Mode

Voltage stacking is a technique where the power distribution networks of two circuit blocks within a core or two cores within a multi-core system are vertically stacked, sharing a common path from Vdd to ground. The conventional method of voltage stacking is shown in FIG. 2.4(a), where the bottom circuit block is vertically stacked with a top circuit block regardless of the executing workloads of the top circuit block. In other words, the top circuit block is vertically stacked with the bottom circuit block for the entire operation of the device.

Voltage stacking has been recently used for logic and memory circuits in 2-D and 3-D integrated circuits to 1) minimize the total power consumption and the peak rush current, which reduces inductive noise (L_di/dt), and 2) limit interconnect wear-out due to electromigration (EM) as the current density is reduced.

Prior work has shown a 60% reduction in transient noise when voltage stacking is applied to a 3-D IC as compared to a non-stacked 3-D IC. In addition, the stacking of SRAM banks during idle mode, as proposed in earlier work, reduces the leakage power by 93%. However, there are limitations of implementing the voltage stacking technique as circuit blocks are stacked during both active and idle mode operation, which include 1) the need for regulation of the midnode voltage (Vmid in FIG. 2.4(a)) as the variation in load current affects the inter-node voltages, 2) variation in voltage due to workload and current imbalances, 3) the need for a boosted supply voltage, which increases the power overhead, and 4) the energy efficiency of voltage stacking is reduced as the imbalance in current load between the stacked voltage domains increases.

In this method and system, however, voltage stacking is applied to a super-Vt core or circuit block only when the super-Vt core or circuit block is in an idle state, which is illustrated in FIG. 2.4(b). The method increases the effective resistance of the stacked path only when a super-Vt core is idle and, therefore, reduces the total leakage current through the stacked path during idle mode operation of the sub-Vt core.

Due to the stacking of only idle cores, the proposed approach is not affected by the adverse effects of conventional voltage stacking technique, where careful regulation is required to negate the workload variations and current imbalances between stacked voltage domains.

During the idle state of the top circuit block, the leakage current through the top circuit block is delivered to the bottom circuit block for computation and storage as shown in FIG. 2.4(b). Therefore, a top circuit block remains unaffected during active mode while the leakage energy of an unused top circuit block is recycled to deliver power to the bottom circuit block.

3.2.3 Reusing Leakage Current of Super-Vt Cores to Drive Sub-Vt Cores

3.2.3.1. System Level Model of Leakage Reuse

The proposed system level model that accounts for the reuse of the leakage current of circuits operating in idle mode and in a super-Vt voltage domain to supply current to circuits operating in a sub-Vt voltage domain is shown in FIG. 2.5. Due to significant idle states in existing state-of-the-art circuits s discussed above, at any given time, at least one super-Vt core (or circuit block) is assumed to operate in idle mode.

The system level model may be applicable to a) a single core with circuit blocks operating at both super-Vt and sub-Vt supply voltages and b) a multi-core system with cores operating at both super-Vt and sub-Vt voltages. Therefore, the proposed leakage reuse technique is categorized as either 1) inter-core, where two cores operating at a super-Vt supply voltage drive a core operating at a sub-Vt supply voltage, or 2) intra-core, where two circuit blocks within a core operate at a super-Vt supply voltage and drive a circuit block operating at a sub-Vt voltage.

3.2.3.2 Circuit Model Accounting for Leakage Reuse

Conventionally, the circuits within a core operating in a single voltage domain receive current through a hierarchical power delivery system. In general, a 10% activity factor implies that 10% of all gates switch at any given time. Therefore, for the 10% of gates within a core, both dynamic and leakage power is consumed, while 90% of the gates consume only leakage power.

The circuit model used to analyze the leakage reuse technique is shown in FIG. 2.6 (substantially repeated from above here for sake of thoroughness). The super-Vt core comprises four functional blocks that are supplied by a conventional hierarchical power delivery system. The ground network is, however, modified to allow for the reuse of the leakage current from the super-Vt CMOS circuits. The functional blocks B and D are assumed to be performing a high activity workload and are highly sensitive to ground bounce and are, therefore, directly connected to true ground. The functional blocks A and C are, however, assumed to be performing low activity tasks and are less sensitive to ground bounce noise. In this case, the leakage current from blocks A and C is used to supply the sub-Vt core. The cumulative total width of all transistors within a functional block provides an estimate of the total leakage current of the circuit during idle mode.

A continuous power supply to the sub-Vt core exists, since at any given time at least one of the functional blocks (either A and C) is operating in idle mode. Both super-Vt blocks A and C are connected to ground through either of two switches, implemented as one PMOS and one NMOS transistor, where A is connected through $S^A_{VG}$ and $S^A_G$, and C through $S^C_{VG}$ and $S^C_G$ as shown in FIG. 2.6. Transistor $S^A_{VG}$ ($S^C_{VG}$) sinks current from block A (C) to the sub-Vt power network through a virtual ground (V GND) during idle mode operation of the blocks, while transistor $S^A_G$ ($S^C_G$) sinks current from block A (C) to true ground during active mode.

3.2.3.3 Control Circuit of the Leakage Reuse Technique

The control circuit block of the proposed leakage reuse technique behaves similar to sleep transistors when power gating as two footer MOS transistors are implemented to switch the operating mode of a super-Vt core between normal activity and leakage reuse. Note that during idle mode operation, the ground node of the super-Vt cores behaves as a virtual ground.

The circuit implementation of the MOS switches is shown in FIG. 2.7 and has been described above.

The proposed leakage reuse technique does not replace power gating. Simultaneous implementation of both power gating and leakage reuse is, therefore, possible. A multi-core system that implements both power gating and the leakage reuse technique is more energy efficient than a system that only applies power gating as current is delivered to a low performance sub-Vt core without requiring a dedicated PDN with expensive voltage regulators.

3.2.4 Energy Overhead and Challenges of Implementing the Leakage Reuse Technique The challenges of implementing the leakage reuse technique, as relating to the energy efficiency of the system, are analyzed in this section. The PMOS and NMOS transistors shown in FIGS. 2.6 and 2.7 and the circuitry that provides the control signal Φ consume additional energy. An analysis of the energy breakeven point (BEP) is, therefore, performed, which is defined as the point where the total energy savings obtained from the implementation of the leakage reuse technique equals the total energy consumed by the PMOS/NMOS switches and the control circuitry. The leakage current model changes significantly from one technology to another. Instead of performing a technology dependent analysis, heuristic based analytical expressions are derived using standard parameters, which are listed in the table shown in FIG. 2.A, that are applicable to any CMOS technology. In order to reduce the complexity of the analysis, a few assumptions are made: 1) the total energy required to operate the sub-Vt core is supplied by one super-Vt core and, therefore, analytical expressions are derived for Core 1 only; a similar analysis can be performed for more complex systems, and 2) separate ground networks are implemented for the active super-Vt core and sub-Vt core to prevent noise coupling.

A schematic representation of an implementation of the leakage reuse technique is shown in FIG. 2.8, where i number of super-Vt cores supply unused leakage current to a subthreshold core. The two footer transistors SV G (PMOS) and SG (NMOS) are utilized as control switches for each super-Vt core, where additional switches are added for a more distributed supply of current to the sub-Vt core. The control signal Φ is set to logic low when an onset of a long idle period of Core 1 is detected, which results in $S^V_G$ turning on and $S_G$ turning off as shown in FIG. 2.9. The control signal applied to the gate of SG flips state when Core 1 switches to active mode.

The onset of the switching transitions of SVG and SG occur at times T0 and T2 as indicated by the transient waveforms shown in FIG. 2.9, while T1 and T3 represent the beginning of a period of steady-state voltage for the sub-Vt core. Assume that the idle activity of Core 1 begins at time t=T0 and Φ as shown in FIG. 2.8 is set to logic 0. As transistor SG begins to turn off, Core 1 begins to supply unused leakage current to the sub-Vt core. In addition, at t=T0 Core 1 switches to an idle state, which results in the charging of $C_{VGND}$ and $C_{int,super-Vt}$. Note that the virtual ground node includes capacitances $C_{VGND}$, $C_{int,super-Vt}$, and $C_{S,super-Vt}$, where half of the internal nodes of the super-Vt core contribute to the capacitance of the virtual ground node. At t=T1, the capacitance of the virtual ground node $C_{VGND}$ is fully charged to the target $V_{GND}$ voltage and the leakage current through $S^V_G$ saturates. The voltage drop across the $S^V_G$ transistor is negligible and $V_{GND}$ is approximately equal to the sub-Vt supply voltage Vdd,sub-Vt of 380 mV. As the potential of the $V_{GND}$ node reaches a steady-state of 380 mV, the overall leakage current of Core 1 is significantly reduced due to 1) an increase in the threshold voltage attributed to the reverse body-bias effect and 2) an increase in the effective resistance when stacked with the sub-Vt core. However, there is an additional energy loss Eloss1, during time interval t=T1*T0 due to the switching of both the SV G and SG transistors, where Eloss1 per cycle is given by (3).

$$E_{loss1} = \frac{1}{2}\alpha_{super-V_t}V_{dd}^2\left(C_G + C_{VG} + C_{int,super-V_t} + \frac{1}{2}C_{S,super-V_t}\right) \quad \text{EQ B3}$$

Similarly, the energy overhead per cycle during the time interval T3*T2 is given by $$E_{loss2} = \frac{1}{2}\alpha_{super-V_t}V_{dd}^2\left(C_G + C_{VG} + C_{int,super-V_t} + \frac{1}{2}C_{S,super-V_t}\right) \quad \text{EQ B4}$$

where at t=T2 Core 1 switches into an active mode and SG and SVG are turned on and off, respectively, which results in the discharge of the V GND node through SG. During t=T2*T1 the unused leakage energy of Core 1 is used for computation by the sub-Vt core. At t=T3 the $V_{GND}$ node of Core 1 discharges while connected to the true ground potential and begins operating in active mode. The total energy overhead per cycle between time interval T0 and T3 due to the implementation of the leakage reuse technique is given by $$E_{loss,total} = E_{loss1} + E_{loss2} =$$

$$\alpha_{super-V_t} V_{dd}^2 \left( C_G + C_{VG} + C_{int,super-V_t} + \frac{1}{2} C_{S,super-V_t} \right).$$

EQ B5

The reduction in the energy consumption due to the utilization of the leakage reuse technique over N number of cycles is given by EQ B6. The $E^{T1}_L$ term describes the total energy savings between time interval T0 and T1 and $E^{cyc}_{sub-V_t}$ is the total energy dissipation per cycle of the sub-Vt core.

In addition, the average leakage energy dissipation per cycle when Core 1 is in active mode and idle mode is given by $E^{cyc}_{L,active}$ and $E^{cyc}_{L,idle}$, respectively.

$$E^{total}_{saved} = E^{T1}_L + \sum_{i=0}^{N} \left( E^{cyc}_{sub-V_t} + E^{cyc}_{L,active} - E^{cyc}_{L,idle} \right)$$

EQB6

The total energy dissipation of the sub-Vt core per cycle, as given by EQB7, is calculated as the sum of the static and dynamic energy dissipated per cycle, where $I_{SVG}$ is the current through transistor $S_{VG}$ and T is the clock period. The energy consumption of the circuit is reduced due to the implementation of the footer transistors SV G and SG, which behave similar to a switch in power-gated circuits. The energy savings between the onset of an idle event (T0) and the time when $V_{GND}$ begins to maintain a steady state (T1) is given by EQB8 and EQB9. The number of completed clock cycles during the time interval T0 to T1 is given as Nx. The value of Nx is empirically formulated in EQB10, where f is the operating frequency of the super-Vt core, Wr is the ratio of the switch size to the size of super-Vt core, and a is the wake up latency, which is 5.27 ns for a 1 GHz clock frequency.

$$E^{cyc}_{sub-V_t} + \alpha_{sub-V_t} C_{sub-V_t} V_{dd,sub-V_t}^2 + I_{S_{VG}} V_{dd,sub-V_t} T$$

EQ B7

$$E^{T1}_L = \frac{F_{DIBL}}{nV_T} N_x T E^{cyc}_L$$

EQ B8

$$= \frac{F_{DIBL}}{nV_T} \frac{\alpha_{super-V_t} \delta V_{dd}}{4\left(\frac{1}{2} + \frac{C_{V_{GND}}}{C_{S,\text{super}-V_t}}\right)} N_x T$$

EQ B9

$$N_x = \frac{fa}{W_r}$$

EQ B10

The average leakage energy for time interval T0 to T1, described by $E^{T1}_L$, is dependent on the drain-induced barrier lowering factor $F_{DIBL}$ (~0.1), the sub-threshold slope factor n (~1.3), and the thermal voltage VT (=kT/q~25 mV).

The leakage factor δ is given as the ratio of the average leakage energy dissipation to the switching energy dissipation per cycle ($δ=E^{cyc}_L/E^{cyc}_S$).

The switching energy dissipation per cycle of the super-Vt core is given by $$E^{cyc}_S = \frac{1}{2} \alpha_{super-V_t} C_{S,super-V_t} V_{dd}^2,$$

EQ B11 where $C_{S,super-Vt}$ represents the total switching capacitance of the core including the drain, source, and gate capacitances as well as the capacitance due to the interconnects. The average leakage energy dissipated per cycle when Core 1 is in active mode (not stacked) is given by $$E^{cyc}_{L,active} = T I_L V_{dd}$$

$$= \delta E^{cyc}_S$$

$$= \frac{1}{2} \alpha_{super-V_t} \delta C_{S,super-V_t} V_{dd}^2,$$

EQ B12 where IL is the average leakage current through all leakage paths in Core 1. The leakage current through the PMOS transistor $S^V_G$ is negligible since the drain of $S^V_G$ is connected to $V_{dd,sub-Vt}$. Therefore, all of IL is assumed to pass through SG during the active mode operation of Core 1.

The average leakage energy dissipated per cycle when Core 1 is in idle mode (stacked) is given by $$E^{cyc}_{L,idle} = T I_{S_G} V_{GND},$$

EQ B13 where ISG is the current through SG when operating in the idle mode. If an average leakage energy dissipation per cycle is assumed, the leakage energy dissipated over N cycles is given by $$\sum_{i=0}^{N} E^{cyc}_{L,idle} = | N T I_{S_G} V_{GND}$$

EQ B14

At the energy break-even point, the reduction in the total energy consumption equals the energy loss due to implementing the leakage reuse technique. Therefore, EQB5 and EQB6 are modified to $$E^{total}_{saved} = E_{loss,total} E^{T1}_L + \sum_{i=0}^{N} \left( E^{cyc}_{sub-V_t} + E^{cyc}_{L,active} - E^{cyc}_{L,idle} \right)$$

EQ B15

$$= \sum_{i=0}^{N} \alpha_{super-V_t} V_{dd}^2 \left( C_G + C_{VG} + C_{int,super-V_t} + \frac{1}{2} C_{S,super-V_t} \right)$$

EQ B16

The energy consumption per cycle remains relatively constant except for a few clock cycles after a power down or power up event. For the provided analysis, a constant energy consumption is assumed for each cycle, where EQB7 is simplified by assuming $E^0_{sub-Vt} = E^1_{sub-Vt} = E^2_{sub-Vt} = E^N_{sub-Vt}$ for N cycles. A similar assumption is made for $E^{cyc}_{L,active}$ and $E^{cyc}_{L,idle}$. Substituting the values of $E^{T1}_L$, $E^{cyc}_{L,active}$, $E^{cyc}_{L,idle}$, and $E^{cyc}_{sub-Vt}$ into EQB16 results in $$\left(E_L^{T1} + NE_{sub-V_t}^{cyc} + NE_{L,active}^{cyc} - NE_{L,idle}^{cyc}\right) = \qquad \text{EQ B17}$$

$$\left(C_G + C_{VG} + C_{int,super-V_t} + \frac{1}{2}C_{S,super-V_t}\right)N\alpha_{super-V_t}V_{dd}^2,$$

where $$N_{break-even} = |N| = \frac{E_L^{T1}}{\left(\left(C_G + C_{VG} + C_{int,super-V_t} + \frac{1}{2}C_{S,super-V_t}\right)\right.} \qquad \text{EQ B18}$$
$$\left.\alpha_{super-V_t}V_{dd}^2 - E_{sub-V_t}^{cyc} + E_{L,active}^{cyc} - E_{L,idle}^{cyc}\right)$$

Advanced power management and task scheduling algorithms are used to identify the idle intervals in a multicore system. The reuse of the leakage current of the super-Vt core is activated through the control signal Φ only when the number of idle cycles in the super-Vt core exceeds $N_{break-even}$ and the voltage on the $V_{GND}$ node meets the target sub-Vt supply voltage. Therefore, the activation of the control signal Φ is formulated as $$\forall i, \Phi_{core,i} = \begin{cases} 0(LR \text{ on}), & \text{when } N > N_{break-even} \text{ \&} \\ & |V_{k,i} - V_{dd,sub-V_t}| \leq 0.1 V_{dd,sub-V_t}^{target} \\ 1(LR \text{ off}), & \text{otherwise} \end{cases} \qquad \text{EQ B19}$$

where i is the super-Vt core identifier for n core= {1,2,3, . . . n}. The voltage at the $V_{GND}$ node after k number of cycles is given as $V_{k,i}$. The target supply voltage of the sub-Vt core is represented by $V^{target}{}_{dd,sub-Vt}$. The minimum number of cycles Nmin that the super-Vt core must be in idle mode is given by EQB20, which ensures an overall gain in the energy efficiency of the system and a supply voltage for the subthreshold core that is within 10% of $V^{target}{}_{dd,sub-Vt}$. The number of cycles required to settle within 10% of $V^{target}{}_{dd,sub-Vt}$ is defined as $N^{target}{}_{dd,sub-Vt}$ $$N_{min} = \max\{N_{break-even}, N_{dd,sub-V_t}^{target}\} \qquad \text{EQ B20}$$

Simulation is performed to determine the total energy consumption of a multi-core system where the required energy to operate the sub-Vt core is supplied by one super-Vt core. The results obtained from simulation are compared with the analytical analysis. The super-Vt Core 1 and the sub-Vt core are each implemented with a chain of six inverters.

To analytically determine the Nbreak-even, the technology parameters listed in FIG. 2.A are applied to EQB18 for both the super-Vt and the sub-Vt core, where $C_{VGND}/C_{S,super-Vt}$=0.1, δ=0.1, $V_{GND} \sim V_{ddsub-Vt}$=0.38V, T=1 ns, $\alpha_{super-Vt}$=1, $\alpha_{subVt}$=0.05, $I_{SG}$=$I_{SVG}$=0.15 $I_{total}$, $I_{total}$=10 uA, Wr=0.125, and $C_{S,super-Vt}$=70 fF. The total area of both the super-Vt and sub-Vt chain of inverters is listed in FIG. 2.B. The analytical and simulated results are plotted in FIG. 2.10, where the number of idle clock cycles corresponding to the break-even point in energy consumption is evaluated for 50 MHz to 1 GHz operating frequencies of the super-Vt core. For example, the number of cycles N when operating at a 1 GHz frequency that results in the energy break-even point ($N_{break-even}$) is 125 and 133 for the analytical and simulated analysis. The Nmin that satisfies EQB20 is taken as 133 cycles. Core 1 must, therefore, be stacked for at least 133 ns when operating at 1 GHz for the leakage reuse technique to provide an improvement in the overall energy efficiency of the circuit. The percent difference between the analytical and simulated results in FIG. 2.10 is calculated as |Analytical-Simulation|/Simulation×100.

The maximum and minimum percent error in the calculated number of idle cycles to provide the energy break-even point using the analytical expressions is, respectively, 11% (at 50 MHz) and 6% (at 1 GHz) as compared to simulated results. Note that the percent error decreases as the operating frequency increases since, for a given difference in the number of cycles between the analytical and simulated results, the relative difference is smaller at higher frequencies due to the larger number of cycles.

The total energy consumed by the super-Vt and sub-Vt cores per cycle and the energy consumed by the switches (SV G and SG) per cycle are characterized for 1 GHz operation of the super-Vt core starting from Nmin (133 idle cycles at 1 GHz) to 10×Nmin (1330 idle cycles), with results shown in FIG. 2.11. The analysis of the leakage reuse technique is normalized to the baseline, where independent power delivery networks are implemented for the super-Vt and sub-Vt cores (described in Topology 1). For the leakage reuse technique, the size of the super-Vt core is increased by 1.2× as compared to the baseline to account for the overhead due to the supporting circuits required to generate and propagate the control signal Φ. The overhead in area due to the supporting circuits as a percentage of the total area is smaller as the size of the super-Vt core increases, since the area of the supporting circuits remains about constant. Similar switching activity is applied to both the leakage reuse and the baseline implementations. The savings in the energy per cycle due to the leakage reuse technique increases as the leakage current from the super-Vt core is supplied for an increasing number of idle cycles. For example, the total energy per cycle is 0.23× the baseline for 1064 idle cycles, while it is 0.89× the baseline for 266 idle cycles. In addition, as the number of continuous idle cycles of the super-Vt core increases, the fewer number of triggered switching events needed to switch to an idle super-Vt core, which reduces the energy overhead due to the switches as a percentage of the total energy consumed. As an example, the energy per cycle of two switches is 0.12× the total energy when charge is reused for 133 cycles, while the switches consume 0.027× of the total energy per cycle when charge is recycled for 1064 cycles.

3.2.5 Characterization and Analysis

The proposed leakage reuse technique was evaluated through SPICE simulation in a 45 nm CMOS process. The super-Vt supply voltage is set to 1.2 V, while the target sub-Vt supply voltage is 380 mV. The 45 nm fabrication process includes low-threshold (low-Vt), nominal threshold (nominal-Vt), and high-threshold devices (high-Vt). Low-Vt transistors are used for the circuit blocks operating at a super-Vt supply voltage to improve performance, while nominal-Vt transistors are used for the circuit blocks operating at a sub-Vt supply voltage to reduce power consumption. In addition, high-Vt NMOS transistors are used for the sleep transistors SAG and SCG to reduce the idle power consumption, while low-Vt PMOS transistors are used for the switches connecting to the sub-Vt core. Note that the threshold voltage of a nominal-Vt, low-Vt, and high-Vt NMOS transistor is, respectively, 410 mV, 322 mV, and 608 mV.

3.2.5.1 Model and Simulation Methodology

The leakage reuse technique is evaluated using a chain of inverters (COI) and two ISCAS89 benchmarks circuit (s27 with 19 gates and s208 with 112 gates). The ISCAS89 benchmark circuits represent super-Vt cores, while separate COIs are used to represent both the super-Vt and sub-Vt cores.

The super-Vt chain included six equally sized inverters, whereas the sub-Vt chain included six tapered inverters that are optimized for sub-Vt operation. The ground networks of both the COI and the ISCAS89 benchmark circuits are modified to enable a connection with either true ground or the sub-Vt power network through the virtual ground of the super-Vt core.

Three circuit topologies are considered for simulation, which are an implementation of the system level model shown in FIG. 2.5 (applicable to both inter- and intra-core current reuse). The circuit topologies include:

Topology 1—Baseline: Two isolated super-Vt circuit blocks representing two individual super-Vt cores and one isolated sub-Vt circuit block (chain of tapered inverters) representing an individual sub-Vt core. Note that there is no connection between the super-Vt and sub-Vt circuit blocks as each circuit is supplied power independently, which is the conventional practice.

Topology 2—Proposed leakage reuse (L.R.): Two isolated super-Vt circuit blocks representing two individual super-Vt cores. The ground network of both the super-Vt circuit blocks is connected through the switching circuit shown in FIG. 2.6 to either true ground or the power network of a sub-Vt circuit block consisting of a chain of tapered inverters. The leakage current of the super-Vt circuit blocks is used to supply power to the sub-Vt circuit block.

Topology 3—Voltage stacking (V.S.): Two isolated super-Vt circuit blocks representing two individual super-Vt cores, where the ground network of both the super-Vt circuit blocks is directly connected with the power network of a sub-Vt circuit block comprising a chain of tapered inverters. In earlier work, stacked voltage domains within the same core are implemented for implicit voltage down conversion to deliver power to near-threshold circuits, which are placed at the bottom of the stacked topology. This configuration delivers power to sub-Vt circuits as shown in FIG. 2.4($a$) and is used to compare with the proposed leakage reuse technique.

Similar input signals and output capacitive loads are applied to all three topologies, which ensures that the active and idle mode transitions are equally applied to the three configurations. The power supply and ground networks of all three circuit topologies are represented with equivalent electrical parameters obtained from the Vcc and Vss pins of a model of the DIP-40 package to analyze the transient noise induced on the power and ground networks. The resistance R, inductance L, and capacitance C of the pins are, respectively, 0.217Ω, 8.18 nH, and 5.32 pF.

The voltage stacking technique is not directly comparable to the leakage reuse technique as the circuit blocks in a voltage stacked system are continuously stacked for the entire duration of the operation of the circuit. In contrast, the leakage reuse technique stacks two circuit blocks within a core or in two different cores within a multi-core system only during the idle mode operation of the circuits operating at a super-Vt supply voltage.

The three circuit topologies are implemented on a COI and the s27 and s208 benchmark circuits operating at 5 MHz. The total active area for the super-Vt circuit blocks, sub-Vt circuit blocks, and switches is listed in FIG. 2.B. The same circuit area is occupied by each topology, except for the leakage reuse technique, where an additional area is required for the switches. Therefore, iso-frequency and iso-area analysis is performed across the three topologies.

Due to the large reduction in the drive strength of the transistors when in sub-Vt operation, the transistor widths are increased to provide sufficient drive current to charge and discharge loads, where the sub-Vt circuit block is 3.24× and 3.12× the total area of the two super-Vt circuit blocks for, respectively, a chain of inverters and the s27 benchmark circuit. However, the area of the sub-Vt circuit block is 0.96× the size of the two s208 circuit blocks as the increased area of s208 (21.9 um2) provides sufficient current to drive the sub-Vt circuit block (21 um2) without further increasing the size of the transistors.

The voltage on the virtual ground node VGND, which is the supply voltage of the sub-Vt block generated by the leakage current of the super-Vt core, is dependent upon several circuit parameters including 1) the ratio of the area of the super-Vt circuit block to the area of the sub-Vt circuit block, which is directly correlated to the current ratio, 2) the total leakage current of the super-Vt circuit block, 3) the on and off current through the switches, which are partly dependent on the threshold voltage, gate voltage, and the dimensions of the transistors, and 4) the total current required by the sub-Vt circuit block. For a set size of the super-Vt and sub-Vt cores, the width of the switches acts as a controlling knob that results in a trade-off between the voltage level at the V GND node and the total area and power consumption. An analysis of the effect of switch size is, therefore, performed when the super-Vt core is active, as described in below.

3.2.5.2 Characterization of Power Consumption

The average power consumption per cycle and peak instantaneous power consumption of the multi-voltage system, which includes the super-Vt and sub-Vt circuit blocks, for all three circuit topologies are shown in, respectively, FIGS. 5.12($a$) and 5.12($b$). The average (instantaneous peak) power consumption of the baseline is 25.24 uW (8.69 mW), 15.47 uW (4.154 mW), and 112.4 uW (7.636 mW) for, respectively, the COI, s27, and s208 benchmark circuits. The average (peak) power consumption of the leakage reuse technique is reduced to 0.63× (0.9×, 0.41× (0.7×), and 0.17× (0.6×) that of the baseline for, respectively, COI, s27, and s208. The benefits of implementing the leakage reuse technique are, therefore, greater as the circuit size increases. However, the leakage reuse technique consumes more power than the voltage stacking technique as the super-Vt and sub-Vt circuits are stacked for the entire duration of circuit operation when voltage stacking is implemented. The leakage reuse technique applied to s208 consumes an average and peak power of, respectively, 2.02× and 2.17 that of the voltage stacking technique.

The circuit blocks operating at a super-Vt supply voltage are characterized for average and peak power consumption at different operating frequencies up to 2 GHz. The voltage stacking (V.S.) technique is limited to frequencies no greater than 25 MHz as the super-Vt circuit does not provide correct output at higher frequencies due to significant noise on the V GND node. In contrast, the implementation of the leakage reuse technique allows for the operation of the super-Vt circuits at higher frequencies (up to 2 GHz in the provided analysis). The chain of inverters operating at a super-Vt supply voltage of 1.2 V is characterized between 5 MHz and 2 GHz using the baseline, leakage reuse, and voltage stacking techniques. The results from simulation of the average and peak power consumption at different operating frequencies is shown in, respectively, FIGS. 2.13(*a*) and 2.13(*b*). At all frequencies, the average and peak power consumption of the leakage reuse technique is less than the average and peak power consumption of the baseline. In addition, the leakage reuse technique exhibits a greater reduction in the average and peak power consumption at higher frequencies as compared to the baseline technique. Therefore, a sufficient amount of leakage current is supplied to the sub-Vt core(s) during the idle mode operation of the nominal cores for a range of operating frequencies. Although voltage stacking consumes less power as compared to both leakage reuse and the baseline, voltage stacking does not provide a discernible output for frequencies greater than 25 MHz.

3.2.5.3 Characterization of Noise on True and Virtual Ground

The voltage drop on the super-Vt power network is within +/−5% of the nominal voltage of 1.2 V for all circuit topologies. However, the voltage noise on the ground network exceeds +/−5% of the ideal ground voltage of 0 V. The characterization of the peak ground voltage bounce on Vss and the settling time of Vss (the time required to settle within +/−5% of the ideal ground voltage) are shown in FIG. 2.14, where the results obtained for the leakage reuse and voltage stacking techniques are normalized to the results obtained for the baseline. The leakage reuse technique exhibits a reduced peak noise on Vss and a reduced settling time as compared to the baseline for the chain of inverters (COI), s27, and s208 circuits. The implementation of the leakage reuse technique on s27 (s208) reduces the peak noise on Vss and the Vss settling time to, respectively, 0.68× (0.29×) and 0.44× (0.37×) that of the baseline. The peak voltage Vss noise on the true ground node (Vss settling time) for the baseline is 30.07 mV (56 ns), 17.66 mV (110 ns), and 85.82 mV (56.5 ns) for, respectively, COI, s27, and s208.

Unlike voltage stacking, the leakage reuse technique permits the stacking of idle super-Vt circuit blocks with the sub-Vt circuit block, while connecting the active super-Vt circuit blocks to true ground. However, the noise transients propagate between the true ground of the active circuit blocks and the virtual ground of the idle circuit blocks. For the leakage reuse technique, the super-Vt active and idle circuit blocks are described as, respectively, non-stacked and stacked. The voltage bounce on the virtual ground node of the super-Vt core is analyzed by characterizing the peak voltage noise and settling time (the time required to settle within, 5% of the steady state VGND) of the COI, s27, and s208 circuits each implemented with the leakage reuse (stacked and non-stacked) and voltage stacking techniques. The results from characterization of the peak VGND noise and the VGND settling time are shown in FIG. 2.15, where the leakage reuse technique is normalized to the voltage stacking technique. The peak VGND (VGND settling time) of the voltage stacking technique is 513.3 mV (64 ns), 511 mV (105 ns), and 431.4 mV (34 ns) for, respectively, the COI, s27, and s208 circuits.

The steady-state voltage on the V GND node (VGND) is the supply voltage of the sub-Vt circuit, which is set to 380 mV. The peak VGND bounce and VGND settling time of the active circuit blocks when implementing the leakage reuse technique (non-stacked) are less than both the voltage stacking technique and the idle circuit blocks implemented with the leakage reuse technique (stacked). In all cases, the voltage bounce on V GND for both the active and idle circuit blocks does not exceed 10% of the rail-to-rail voltage of 1.2 V for the super-Vt Vdd and 380 mV for the sub-Vt Vdd.

The peak voltage noise on VGND (VGND settling time) for the leakage reuse technique implemented on the s208 circuit is reduced to 0.97× (0.4) and 0.28× (0.23×) in, respectively, the stacked and non-stack mode, as compared and normalized to the voltage stacking technique. The peak voltage noise on V GND, peak voltage noise on true ground, and the $V_{dd,sub-Vt}$ are characterized in the tt, ff, and ss process corners for both the leakage reuse and voltage stacking techniques. The worst-case process variation, taken as the larger of the two values of |tt−ff|/tt×100% and |tt−ss|/tt×100% is determined for the s208 benchmark circuit. The leakage reuse technique exhibits a worst-case variation in the peak VGND voltage noise for the stacked topology, peak VGND voltage noise for the non-stacked topology, peak Vss voltage noise, and sub-Vt Vdd of, respectively, 0.82%, 5.82%, 5.05%, and 1.54%. The voltage stacking technique exhibits a worst-case variation of 9.6%, 56.33%, and 2.05% for, respectively, peak VGND noise, peak Vss noise, and sub-Vt Vdd.

3.2.5.4 Characterization of Switch Size Used for Implementation of the Leakage Reuse Technique A circuit implementing the leakage reuse technique is sensitive to the dimensions of the transistors SG and SVG used as switches. The size of the switches impacts both the power consumption and performance as a large instantaneous transient current is induced when the switches are turned on. The leakage reuse technique implemented on the s27 benchmark circuit is characterized for three different switch sizes, with results as shown in FIG. 2.16. The switch sizes are represented as a percentage of the total area of the two s27 circuit blocks operating at a super-Vt supply voltage, where the three implemented switch sizes are 4.6%, 7.6%, and 10.4% of the total area. Both the total and peak power consumption increase with larger switches, as indicated by the analysis of the switch occupying 10.4% of the total area.

The switch occupying 10.4% of the area consumes an average and peak power of, respectively, 1.03× and 2.15× that of the total and peak power of the switch occupying 4.6% of the area. However, a 10.4% switch area reduces the peak noise on the VGND node by 0.07× and 0.98× in, respectively, the non-stacked and stacked mode, as compared to switches occupying 4.6% of the total area. In addition, due to the increased influx current (initial current) through the switches, the peak bounce on Vss and the settling time of Vss for switches occupying 10.4% of the total area increase by, respectively, 1.64× and 1.83× that of switches occupying 4.6% of the total area. Therefore, there is a trade-off between the power consumption and ground bounce when sizing the switches, where for the non-stacked mode, the peak noise on the V GND node is reduced to 0.07× at the cost of increasing the total power consumption and the switch area by 1.03× and 2.26×, respectively, when increasing the percentage of the total area occupied by the switches from 4.6% to 10.4%.

In addition, the noise on the V GND node (non-stacked) is characterized for 15%, 10%, and 5% allowed voltage bounce from the nominal value of 380 mV, which results in an increase in the area and power consumption due to the larger switches necessary to reduce the noise on the VGND node, as shown from results listed in the table in FIG. 2.C. There is an average increase in the power overhead of 1.03× when the voltage noise on the VGND node is constrained to 5% rather that 15% of the rail-to-rail voltage of Vdd (1.2 V for the super-Vt core).

3.2.5.5 Trade-off Between Voltage Stacking and Leakage Reuse Technique

The transient analysis of both the leakage reuse and voltage stacking techniques is shown in FIG. 2.17, where the voltage bounce on the VGND node and the voltage levels of the logical output from the super-Vt and sub-Vt cores are compared.

Similar clock and input switching patterns are applied to both implementations of the circuit. The transient simulation is performed using two super-Vt cores each consisting of an ISCAS s27 benchmark circuit and one sub-Vt core consisting of a chain of six inverters. The clock, SV G, SG, VGND, and output signals of one core are shown in FIG. 2.17. In addition, clock-gating is applied when Core 1 is inactive. In the case of voltage stacking, although Core 1 is idle, the switching transients (L•di/dt) of the super-Vt Core 2 directly couple into the virtual ground node, where the charging and discharging of internal nodes results in significant voltage noise due to a large amount of internal capacitance. The noise induced on the VGND node directly impacts the logical output of Core 2, where the voltage for a logic 1 varies from 0.17 V to 0.41 V, which causes unwanted delay and logical failure for the circuits connected to the logical outputs of the super-Vt cores. In addition, the noise induced on the virtual ground node of the voltage stacked super-Vt core directly couple to the supply node of the sub-Vt circuits as the V GND node and sub-Vt supply node are shorted when voltage stacking is implemented. Therefore, additional voltage regulators are required to generate a steady supply voltage for the bottom core in the stack when voltage stacking is implemented, which results in a significant overhead in energy consumption.

In contrast, for the leakage reuse technique, the VGND node of Core 1 is not affected by the switching of Core 2. A stable voltage is, therefore, present at the VGND node that is used to supply current to the sub-Vt core. The logical outputs of Core 2 are full-swing voltage signals, even as Core 1 is stacked with the sub-Vt circuits. In addition, a stable VGND voltage provides a stable $V_{dd,sub-Vt}$ and, therefore, a stable sub-Vt output signal as shown in FIG. 2.17.

Simulated results of the power consumption and peak voltage on the V GND and true ground nodes obtained using s27 (represents each super-Vt circuit block) and a chain of inverters (represents the sub-Vt circuit block) are listed in FIG. 2.D. The super-Vt and sub-Vt circuit blocks are sized to generate a sub-Vt supply voltage of 380 mV.

The voltage stacking technique reduces the leakage current for the entire duration of operation through the stacking effect, which increases the effective resistance in a given charging or discharging path. Therefore, the total power, peak power, and peak Vss are reduced as compared to the baseline and leakage reuse technique at the cost of increased VGND bounce, as indicated by results shown in FIGS. 2.12, 2.14, and 2.15. For s27, the resulting peak VGND noise due to the implementation of the voltage stacking technique is 2.07× greater than the leakage reuse (non-stacked) technique, which imposes severe limitations for circuits operating in super-Vt as the drive strength of the NMOS transistors is significantly reduced. Therefore, the propagation delay of the circuits connected to the output of the super-Vt circuit block increases. The fanout-of-four (FO4) delay is characterized at 1.2 V in a 45 nm CMOS technology for ideal ground and for voltages of 120 mV, 420 mV, and 511 mV on the VGND node obtained from the results shown in FIG. 2.15 for, respectively, the non-stacked LR, the stacked LR, and the VS technique.

The implementation of the voltage stacking and the leakage reuse techniques result in an increase in the FO4 delay of, respectively, 4.17× (VGND of 511 mV) and 1.24× (VGND of 120 mV) as compared to the baseline technique (ideal ground).

In addition, the noise margins of the circuits connected to the output of s27 are significantly degraded as the voltage on the V GND node increases. The noise margins of a CMOS inverter (PMOS width of 3.6 m and NMOS width of 1.2 um) are characterized at a 5 MHz operating frequency and with a 5 fF capacitive load. The noise margin low of the CMOS inverter is 483 mV, which is less than the 511 mV voltage on the VGND node when implementing the voltage stacking technique. Therefore, logic low is not discernible with the voltage stacking technique if an inverter is connected to the output of s27. In contrast, the leakage reuse technique implemented on s27 provides a discerning logic low as the voltage on the VGND node is 120 mV, while also reducing the total and peak power consumption to, respectively, 0.41× and 0.7× that of the baseline. However, the FO4 delay increases by 1.24× as compared to the baseline.

The peak voltage of 420 mV on the VGND node during the stacking mode of the leakage reuse technique does not effect the circuit delay and noise margin as the stacked super-Vt circuit blocks are operating in idle mode.

3.3 Leakage Current Recycling

3.3.1 Leakage Current Recycling

The proposed power management technique is applied to only idle cores such that the circuit is unaffected when operating in active mode. The leakage current from idle cores is recycled and delivered to an active core within a multiprocessor system-on-chip (MPSoC) platform through voltage stacking.

3.3.1.1 Leakage Reuse Model

The proposed model of leakage current recycling is shown and discussed in detail above but shown again for orientation to the reader in FIG. 3.1.

In a MPSoC platform, m number of donor cores are connected to k number of receiver cores through m number of leakage control blocks (LCBs). Each LCB is implemented with control signals Φm and Φm (Φm=Φm for leakage reuse) that are connected to gate terminals of one PMOS and one NMOS transistor, respectively. Note that both the number of donor and receiver cores are scalable at design time. During the normal activity when a donor core m is executing a workload, a logic high is applied to the Φm of LCBm block such that the ground node of all transistors within the donor core m is connected to the ground (GND) grid. This ensures that normal activity of donor cores remain unaffected. At the onset of an idle period (≥break-even point NBE,LR,m), a logic low is applied to the Φm of LCBm block such that the donor core m and the receiver core are stacked. The stacking serves two primary purposes: 1) produces a virtual ground voltage that is used as the supply voltage of the receiver core and 2) reduces the total leakage current of the idle donor core m.

Conventional voltage stacking technique stacks two cores (top and bottom) regardless of their activity (during both active and idle periods), where the executing workloads of one core affects the other. Therefore, expensive on-chip voltage regulators and closed-loop power management techniques are required to maintain a steady supply voltage for the bottom core. However, the proposed technique where ONLY idle donor cores (=top core(s)) with no workload activity are stacked with receiver core(s) (=bottom core(s)), expensive voltage regulators are not required to maintain a stable supply for a receiver core. The simulated results presented below shows that use of only on-chip decoupling capacitors is sufficient to negate the transients of PDN and, therefore, maintain a stable supply voltage for a receiver core.

The number of donor cores required to generate a desired supply voltage for a given receiver core is determined at design time. The desired supply voltage of receiver core is set in two ways a) by adjusting the ratio of area of donor and receiver core and b) by using a charge booster such as on-chip switched capacitor based voltage doubler to raise the supply level of receiver core.

3.3.1.2 Scheduling of Idle Donor Cores for Leakage Current Recycling

Conventional hardware and software based power management techniques do not account for leakage reuse despite the opportunities of efficiently selecting the idle donor cores for leakage reuse.

In the system and method herein, we choose the idle donor core or circuit block for leakage reuse so that the number of transistor switching at leakage control block is minimized and energy-efficiency is maximized. To the best of our knowledge, this is the first work that addresses the scheduling of idle cores for leakage current recycling. The proposed algorithm is equally applicable to leakage reuse at the core level as well as at the granularity of circuit block level.

The leakage reuse technique requires the scheduling information of donor cores to effectively choose the idle donor cores for leakage reuse. In order to evaluate the true effectiveness of the proposed leakage reuse technique, the application scheduling algorithm needs to execute a task at a shortest time possible and as well as with minimal idle time in a multi-core platform. The heterogeneous earliest-finish time (HEFT) fulfills the above mentioned requirements as a) it minimizes the overall completion time by providing an execution rank for each task in an application for a set number of cores in a multi-core system, computation cost of each task, and communication cost of each edge, and b) it schedules the tasks based on an insertion-based policy that assigns tasks in idle time slots between two already scheduled tasks on a core, which minimizes the idle periods.

Recently, dynamic voltage and frequency scaling is applied when executing the HEFT, which provides an estimation of total number of processor cycles executed by each core for a given task with a frequency range between 1 GHz to 2 GHz. The system herein uses the DVFS enabled HEFT algorithm as the application scheduler for donor cores, which sends the scheduling information to the proposed longest idle time-leakage current recycling (LIT-LR) algorithm as shown in FIG. 3.1. The LIT-LR algorithm generates and sends the bit-stream to LCB block to efficiently schedule the idle donor cores for leakage current recycling. In addition, directed acyclic graph (DAG) is used to represent the application workload of donor cores and, consequently, applied to HEFT algorithm.

3.3.1.3 Longest Idle Time-Leakage Current Recycling (LIT-LR) Algorithm

The proposed LIT-LR algorithm to efficiently schedule idle donor cores for leakage current recycling is shown in Algorithm 1. The inventors first calculated the execution order of each core Order$_{core}$ for the given task graph using the HEFT algorithm. Then, they identified the number of processor cycles required for each task Pcycles$_{task,i}$ in a DVFS enabled MPSoC platform. The system can, therefore, apply Order$_{core}$ and Pcycles$_{task,i}$ to Algorithms 1 and 2 shown in FIGS. 1.I and 1.II.

Based on the values of number of cores m, number of tasks in each task graph Task$_{num}$, Order$_{core}$, Pcycles$_{task,i}$, number of cycles corresponding to break-even point NBE, LR the LIT-LR first calculates the earliest execution time of each task executing on m number of cores. Depending on the task execution order and idle intervals, each core dynamically gets a ranking, where a core with longest idle time gets the highest ranking and a core with shortest idle time gets the lowest ranking. The scheduler gives priority to highest ranking idle donor cores when assigning for leakage current recycling and, therefore, sends bit-stream to corresponding LCB.

3.3.2 Simultaneous Implementation Of Leakage Reuse And Power Gating

The state-of-the-art power gating techniques and algorithms do not include leakage current recycling despite the opportunity of significant improvement in energy-efficiency. On the other hand, despite the benefits of leakage current recycling, the overall system energy efficiency is not improved unless all idle donor cores are scheduled for leakage current recycling at any given time. In a MPSoC platform the idle donor cores that are not scheduled for leakage current recycling continue to leak current. In this paper, we make a case for simultaneous implementation of power gating and leakage recycling that is equally applicable to block, core, memory, and NoC level power gating. In this paper, only donor cores are considered for power gating.

The opportunity of using both power gating and leakage reuse comes with a new complexity as both techniques deals with idle circuits or cores in a multi-core system. Power gating is best used when the core with longest idle time is placed in deep sleep mode and the core with shortest (≥break-even point NBE,PG) idle time is placed in light sleep mode. Note that deep sleep and light sleep correspond to the largest and smallest wake-up penalty, respectively.

Similarly, the leakage reuse technique is best utilized when the core with longest idle time is placed in leakage reuse mode to minimize switching energy overhead. Therefore, the maximum benefit will be achieved when the cores with maximum idle times are assigned to either power gating or leakage reuse. Assigning the longest idle core to leakage reuse will be beneficial only when the donor core is just providing sufficient current to receiver core. If the amount of leakage current of a particular donor core or the number of donor cores is more than what receiver core requires, there will be an overkill situation that will result in loss in energy efficiency. On the other hand, power gating improves the overall energy efficiency for a given donor core only when the reduction in leakage current from power gating is larger than savings from leakage current recycling (reduction in leakage current plus the total energy consumed by the receiver core. Therefore, deciding which technique gets the priority for idle core assignment is an optimization problem.

3.3.2.1 Longest Idle Time-Simultaneous Power Gating and Leakage Reuse (LIT-LRPG) Algorithm This disclosure describes a power management algorithm longest idle time-simultaneous power gating and leakage current recycling (LIT-LRPG) that dynamically assigns the idle donor cores for both power gating or leakage current recycling, which is shown in Algorithm 2. The LIT-LRPG dynamically applies a core idleness based ranking to each core, which is similar to Algorithm 1. The proposed technique complements the existing power management techniques, where the LIT-LRPG algorithm can be incorporated on top of existing power gating techniques.

The priority variable δm defines which technique (LR/PG) may provide more energy savings for an idle donor core and, therefore, is assigned to either power gating or leakage current recycling mode. For a δm of 1, the idle core m is assigned for leakage current recycling, while the rest of the idle cores starting from core with second longest idle time are assigned for power gating. Similarly, for a δm of 0, the idle core m is assigned for power gating, while the core with second longest idle time is assigned for leakage current recycling.

It is possible to assign δm at design time such that a fixed priority is assigned for LR vs PG, where one is assigned with a core with longest idle time and another with second longest idle time. However, we introduce a dynamic assignment of δm through linear programming shown between lines 3 and 8 in Algorithm 2. The variables X and Y are the impact factor of, respectively, LR and PG on the overall energy efficiency, where the a higher value indicates higher energy efficiency and assigns a logic high to δ. The variables LRwake-up and PGwake-up are wake up latencies normalized to cycle time for, respectively, leakage reuse and power gating techniques. The variables Eloss,LR and Eloss,PG are energy loss normalized to total energy consumed by the donor core during idle state for, respectively, leakage reuse and power gating technique. The energy loss is function of energy consumption of an idle donor core Edonor,idle, technology dependent fitting parameter η, energy consumed by LR switches Eswitch,LR, and energy consumed by PG switches Eswitch,PG such that $$E_{loss,LR} = \frac{\eta \cdot E_{switch,LR}}{E_{donor,idle}} \text{ and } E_{loss,PG} = \frac{\eta \cdot E_{switch,PG}}{E_{donor,idle}}. \quad \text{EQC1}$$

Additionally, $$E_{saved,LR} = \frac{E_{donor,idle} - E_{switch,LR} E_{receiver,LR}}{E_{total}} \quad \text{EQC2}$$

and $$E_{saved,PG} = \frac{E_{donor,idle} - E_{switch,PG}}{E_{total}} \quad \text{EQC3}$$

are the savings in energy normalized to total energy for, respectively, leakage reuse and power gating technique. In addition, the Lmax is the maximum allowed latency normalized to cycle time and $$E_{loss,max} = \frac{E_{donor,idle}}{E_{total}} \quad \text{EQC4}$$

is the maximum allowed loss in energy normalized to total energy.

3.3.3 Simulation Setup

The power gating mode transitions causes noise in the PDN due to switching of footer transistors in a power gated circuit. The leakage current recycling from idle cores causes similar switching events and, therefore, it is required to evaluate both leakage recycling and power gating under the presence of a PDN. In this work, an optimized PDN with off-chip and on-chip parameters is designed under the presence of process variation so that the effects of switching are accurately captured.

Both the LIT-LR and LIT-LRPG algorithms are evaluated through SPICE simulation using a 45 nm CMOS technology. A homogeneous MPSoC platform with five homogeneous cores are used, where four cores are used as donor core and one core is used as receiver core. The donor cores are operated at 1.2 V supply with a 1 GHz clock frequency, while a 340 mV supply is generated for the receiver core operating at 100 MHz from the recycled leakage current of four donor cores. Note that the supply voltage of receiver core is scalable as mentioned in Section above depending on the application and available hardware resources. In this paper, a sub-threshold supply voltage of 340 mV is generated for a low-performance receiver core. The ISCAS89 benchmark circuits and boolean logic circuits are used within each of the four donor cores, while the receiver core is implemented as either a s27 benchmark circuit or a 32-bit ARM Cortex M0 core for two independent simulations.

An application, represented by a DAG with nine periodic tasks, is used for a non-preemptive scheduling of donor cores, where the task graph is shown in FIG. 2.2. The execution order of four donor cores for the executed application is shown in FIG. 2.3. During the execution of a task on a given core in four-core system, the remaining cores are idle and, therefore, available for LIT-LR and LIT-LRPG scheduling. The longest idle period for each core when executing nine tasks is determined through the LIT-LR algorithm. For example, the Task 0 is executed on core 1 as shown in FIG. 3.3, while core 4 provides the longest idle time before starting execution and, therefore, assigned with largest index value (C4,index=5). In this case, core 4 is assigned for leakage current recycling when executing Task 0 on core 1.

Similarly, core 2 provides the longest idle time and assigned for leakage current recycling when executing Task 2 on core 3. An accurate estimation of number of cycles corresponding to the break-event point NBE requires a separate analysis. In this disclosure, Pcycles$_{task,i}$ is assumed as larger than NBE for the entire task graph since only one receiver core is used for leakage current recycling and four homogeneous donor cores are used for both LR and PG. There is no existing algorithm that schedules idle cores for leakage current recycling. Therefore, the inventors compared the proposed LIT-LR algorithm against random assignment of available idle donor cores for leakage current recycling. Based on the idle core assignment from LIT-LR and LIT-LRPG algorithms, bitstreams are generated and supplied to the LCB for SPICE simulation. For LIT-LR algorithm one bit control signal is generated and supplied to Φm, while two-bits control signal is generated and supplied to LCB for LIT-LRPG algorithm. Note that same number of transistors are used in each LCB for both LIT-LR and LIT-LRPG algorithms.

Optimized PDN with Off-Chip and On-Chip Model. The four donor cores are powered through an optimized PDN with both off-chip parameters and on-chip distributed power and ground networks as shown in FIG. 3.4. The off-chip and on-chip parameters as listed in the table shown in FIG. 3.A. A 8×5 on-chip grid is used for simulation to achieve reasonable accuracy without significant overhead in simulation, where the on-chip grid parameters (Rgrid and Lgrid) and C-4 bumps parameters (Rbump and Lbump) are taken from a known four core SoC. The off-chip voltage regulator module (VRM), board (PCB), package, C-4 bump parameters are optimized based on other known PDN models. The output of VRM is maintained at 1.2V to emulate the closed-loop response of a VRM.

On-chip decoupling capacitors (Codc) are placed in each load point to nullify the voltage ripples, where a total of 4 nF of decoupling capacitance is used for four donor cores. In addition, an on-chip decoupling capacitor Codc,receiver of 50 pF is used at the supply node of receiver core to minimize the ripple in virtual ground node. The frequency response of the PDN is shown in FIG. 3.5. The first droop of the PDN is responsible to peak impedance as well as peak voltage noise and generated due to the resonance between C-4 bumps inductance and on-chip decoupling capacitors. The maximum impedance of the PDN is found at 700 MHz with a value of 320 mΩ, which is much lower than target impedance (VDD×%ripple Imax–Imin) of the PDN. The PDN is optimized to maintain the voltage ripple within 10% in both VDD and GND grids.

3.3.4 Results and Discussion

The LIT-LR algorithm is evaluated through SPICE simulation using the circuit setup shown in FIG. 3.4 under process variation (ss, tt, and ff corners). The switching transients of leakage current recycling is characterized with three different sizes of leakage control block (LCB): 7.5%, 15%, and 30% of the area of a donor core. For the generated execution order from HEFT algorithm, the idle donor core assignments for leakage reuse through LIT-LR algorithm and random assignment are listed in the table in FIG. 3.B. The bitstreams generated by both LIT-LR and random algorithms are supplied to the LCB for SPICE simulation. The transient behavior of leakage current recycling when executing the LIT-LR algorithm is shown in FIG. 3.6, where the size of LCB is 7.5% of a donor core. The outputs of a donor and a receiver core are plotted, which are operated by a clock frequency of, respectively, 1 GHz and 100 MHz. Despite the recycling of leakage current at every clock cycle a full voltage swing is always maintained at the output of all four donor cores (the output of only one donor core is shown). In addition, a steady sub-threshold (Sub-Vt) supply voltage of 340 mV is maintained at the output of the receiver core. Additional characterization of maximum and minimum voltage at the supply node of the receiver core aka the VGND node is performed under process variation with three different sizes of LCB blocks with the results listed in the table shown in FIG. 3.C. Despite large MOS switches (up to 30% of a donor core) in each LCB and with extreme process corners (ss and ff), the maximum and minimum supply voltage of receiver core remained within ±3% of 340 mV. Therefore, the proposed leakage current recycling technique and scheduling algorithm provides a stable supply voltage for the receiver core with the use of only on-chip decoupling capacitors.

The maximum supply voltage VDD on the on-chip PDN grid, the peak power consumption of MPSoC system, and the total energy consumption of leakage control blocks are characterized using the LIT-LR and random core assignments under ss, tt, and ff process corners with the results shown in FIG. 3.7. The idle donor core assignment using the LIT-LR algorithm reduces the switch energy by 27%, 25%, and 24% in, respectively, ss, tt, and ff corners as compared to the random algorithm. The peak power consumption of the LIT-LR assignment is reduced by 8.4%, 7.4%, and 5.8% as compared to the random assignment in, respectively, ss, tt, and ff corners. In addition, the maximum VDD in on-chip distributed PDN grid is reduced by 0.64%, 2.1%, and 1.3% when the LIT-LR assignment is used in, respectively, ss, tt, and ff corners.

Similar to to LIT-LR algorithm, the bitstreams generated from LIT-LRPG algorithm are supplied to FIG. 3.4 to evaluate the simultaneous implementation of LR and PG using SPICE simulation at a tt corner and with a LCB size of 7.5% of a donor core. However, in this case two-bit signals are passed to each leakage control block; Φm to PMOS and Φm to NMOS as shown in FIG. 3.1. The simulated results obtained in 45 nm CMOS technology are used to solve the optimization problem shown between line 3 and 4 in Algorithm 2. The LRwake-up and PGwake-up are simulated as, respectively, 1.1 and 1.2 for a 1 GHz clock frequency.

The values of Edonor,idle, Eswitch,LR, Eswitch,PG, Etotal are found as, respectively, 4.75 pJ, 0.16 pJ, 0.63 pJ, and 29.2 pJ. Consequently, an optimum solution is found with a larger value of X by using the values of Eloss,LR, Eloss,PG, Esaved,LR, Esaved,PG, Lmax, and Eloss,max as, respectively, 0.33, 1.33, 0.162, 0.14, 5, and 0.17 (Edonor,idle/Etotal). Due to the use of homogeneous cores the value of δm is same for all donor cores. Therefore, in this case the idle donor core with longest idle period is always assigned for leakage current recycling.

The peak power, average power consumption per cycle, and total energy consumption are characterized with four topologies: T1) simultaneous implementation of leakage current recycling and power gating, T2) power gating only, T3) leakage current recycling only, and T4) without using either leakage current recycling or power gating (baseline). The simulation is performed with two sizes of receiver cores: one that contains only an s27 benchmark circuit (3.36 μm2) and another that consists of a 32-bit ARM Cortex M0 core (98930 μm2). The ARM core is synthesized to operate at a 340 mV supply voltage and the current trace for a 10% activity factor is used in FIG. 3.4 for SPICE simulation. The size of each donor core is increased by 1750× (equivalent to 1750 s27 blocks) to provide sufficient leakage current to the ARM core operating at 340 mV. The simulation results with four topologies are shown in FIG. 3.8. The simultaneous implementation of LR and PG reduces the total energy of donor cores by 50.2% (75.5%), 14.4% (18%), and 5.7% (11.2%) when using s27 (ARM Cortex M0) as the receiver core as compared to implementation with, respectively, baseline, only power gating, and only leakage current recycling. In addition, the use of leakage current recycling reduces the average power consumption per cycle of LCB by 9.9% (7.6%) as compared to power gating technique when using s27 (ARM core) as the receiver core. Additionally, the simultaneous implementation of PG and LR reduces the peak power consumption by 45.2% (66.7%), 11.9% (22%), and 1.62% (4.2%) as compared to, respectively, baseline, only PG, and only LR when using s27 (ARM core) as the receiver core. Although the simultaneous implementation of LR and PG exhibit a higher LCB power consumption than individual implementation of power gating and leakage current recycling, the energy consumption and peak power consumption of the overall MPSoC system is reduced.

3.3.5 Conclusion

As described above, circuit and algorithmic techniques for dynamic idle core management are proposed to reduce the leakage current as well as to improve the overall system energy efficiency in a MPSoC platform. The leakage current of idle donor cores are recycled to generate a supply voltage of 340 mV with less than ±3% variation under the presence of an optimized PDN and process variation, where the generated 340 mV is used as the supply voltage of a receiver core. A longest idle time based algorithm LIT-LR dynamically assigns the idle cores for leakage current recycling. The execution of the LIT-LR algorithm on a homogeneous system with five cores exhibited a reduction of switch energy and peak power consumption by 25% and 7.4% as compared to the random assignment. In addition, a LIT-LRPG algorithm simultaneously implements leakage current recycling and power gating and through simulation it is shown that the overall energy efficiency of a MPSoC platform is maximized when both leakage current recycling and power gating are used together. The execution of LIT-LRPG algorithm through SPICE simulation shows that the total energy consumption is reduced by 50.2%, 14.4%, and 5.7% as compared to, respectively, the baseline topology that includes neither leakage reuse or power gating, only power gating, and only leakage current recycling. In addition, the leakage current recycling reduces the power consumption of footer switches by 9.9% as compared to the power gating technique. Therefore, the dynamic idle core management techniques are suitable to be implemented in isolation as well as with any existing power gating technique to improve the overall system energy-efficiency.

While the invention has been described with reference to the embodiments above, a person of ordinary skill in the art would understand that various changes or modifications may be made thereto without departing from the scope of the claims.

The invention claimed is:

1. A system for delivery of power to subthreshold (sub-Vt) circuits, the system comprising:
    a super-threshold (super-Vt) core comprising at least four circuit blocks A, B, C, and D;
    a sub-Vt core;
    a NMOS transistor that connects a virtual ground to a true ground when either of the circuit blocks A or C is in active mode; and
    a PMOS transistor that connects the virtual ground to a power network of the sub-Vt core when either of the circuit blocks A or C is idle,
    wherein the sub-Vt core uses leakage current from either of the circuit blocks A or C of the super-Vt core as a source of continuous power when the corresponding one of the circuit blocks A or C is idle.

2. The system of claim 1, wherein the circuit blocks A and C, and B and D are functional blocks within the super-Vt core, and wherein at least the circuit blocks A and C are supplied by a conventional hierarchical power delivery system.

3. The system of claim 1, wherein the circuit blocks B and D are directly connected to the true ground.

4. The system of claim 1, further comprising a control circuit that regulates an operating mode of the at least four circuit blocks A, B, C, and D of the super-Vt core based at least on workload of the super-Vt core.

5. The system of claim 4, wherein the control circuit switches the operating mode of either of the circuit blocks A or C from the active mode to a leakage reuse mode when either of the circuit blocks A or C is idle.

* * * * *